United States Patent
Yoshida et al.

(10) Patent No.: US 6,797,584 B2
(45) Date of Patent: Sep. 28, 2004

(54) SEMICONDUCTOR DEVICE AND METHOD OF FABRICATING THE SAME

(75) Inventors: Masahiro Yoshida, Tokyo (JP); Kazuya Suzuki, Tokyo (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/125,427

(22) Filed: Apr. 19, 2002

(65) Prior Publication Data

US 2003/0107070 A1 Jun. 12, 2003

Related U.S. Application Data

(62) Division of application No. 09/225,547, filed on Jan. 5, 1999, now Pat. No. 6,445,028.

(30) Foreign Application Priority Data

Aug. 27, 1998 (JP) ............................................ 10-241676

(51) Int. Cl.[7] .............................................. H01L 21/20
(52) U.S. Cl. ...................... 438/396; 438/238; 438/253; 438/381
(58) Field of Search ................................ 438/253, 396, 438/238, 281

(56) References Cited

U.S. PATENT DOCUMENTS

| | | | |
|---|---|---|---|
| 5,241,201 A | | 8/1993 | Matsuo et al. |
| 5,330,614 A | * | 7/1994 | Ahn ........................... 438/396 |
| 5,496,757 A | * | 3/1996 | Rosner ....................... 438/253 |
| 5,804,852 A | | 9/1998 | Yang |
| 5,905,281 A | * | 5/1999 | Wu ............................. 257/309 |
| 6,104,055 A | | 8/2000 | Watanabe |
| 6,153,899 A | | 11/2000 | Ping |
| 6,445,028 B1 | * | 9/2002 | Yoshida et al. ............. 257/306 |

* cited by examiner

*Primary Examiner*—Amir Zarabian
*Assistant Examiner*—Jeff Vockrodt
(74) *Attorney, Agent, or Firm*—Volentine Francos, PLLC

(57) ABSTRACT

First and second transistors are formed on the principal surface of the semiconductor substrate, and an insulating film is formed over the principal surface of the semiconductor substrate so as to cover the first and second transistors. A first storage node is connected to the first transistor and has a first enclosed wall structure which is formed over the insulating film and encloses a surface region of the insulating film. A second storage node is connected to the second transistor and has second enclosed wall structure which is formed over the insulating film and surrounds the first enclosed wall structure. A capacitor insulating film covers the first and second enclosed wall structures, and a cell-plate is formed on the capacitor insulating film.

8 Claims, 27 Drawing Sheets

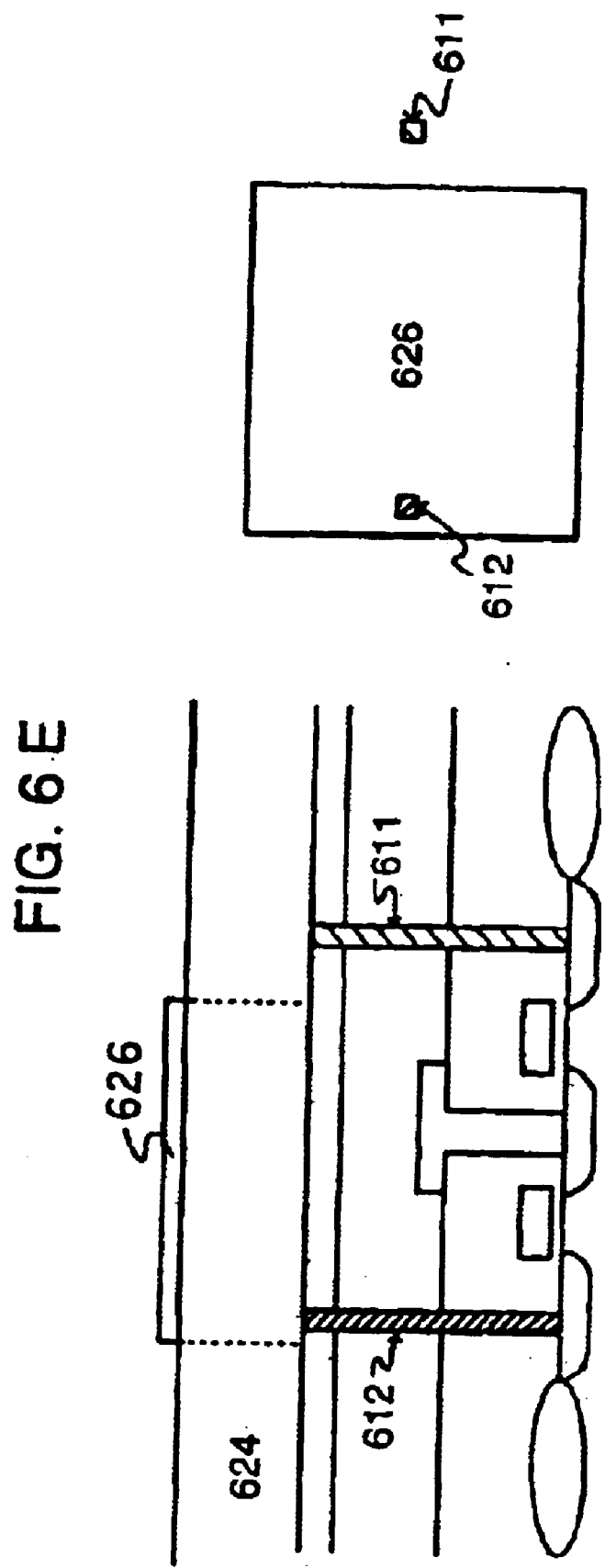
FIG. 6.E

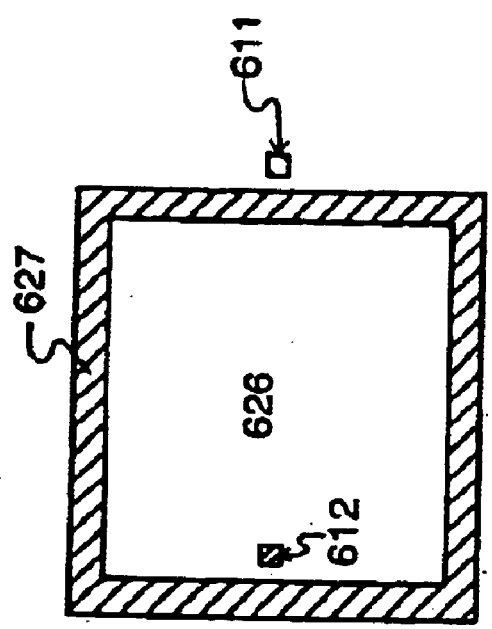
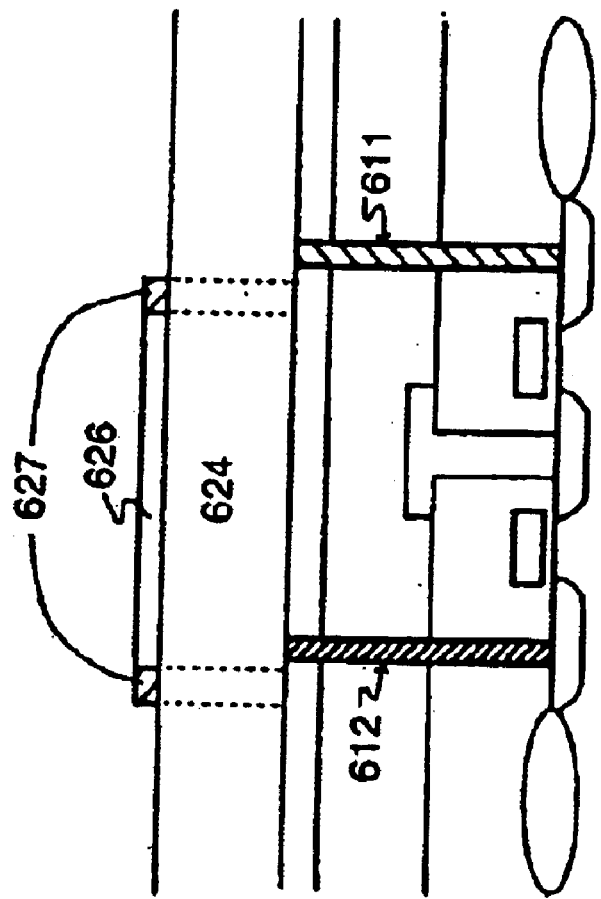
FIG. 6F

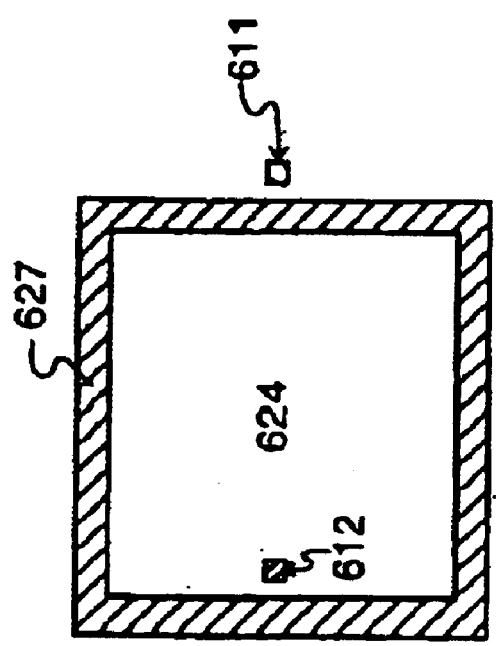
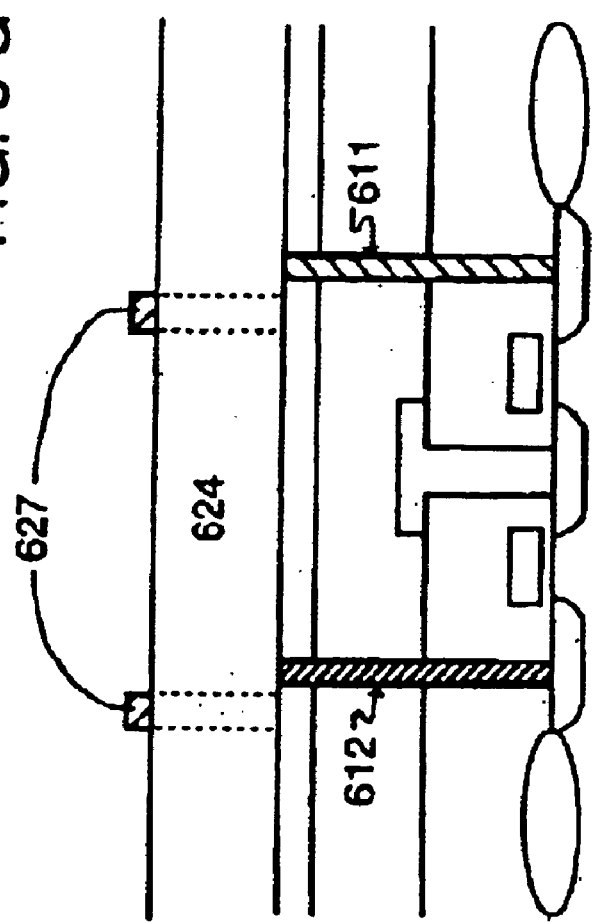
FIG. 6G

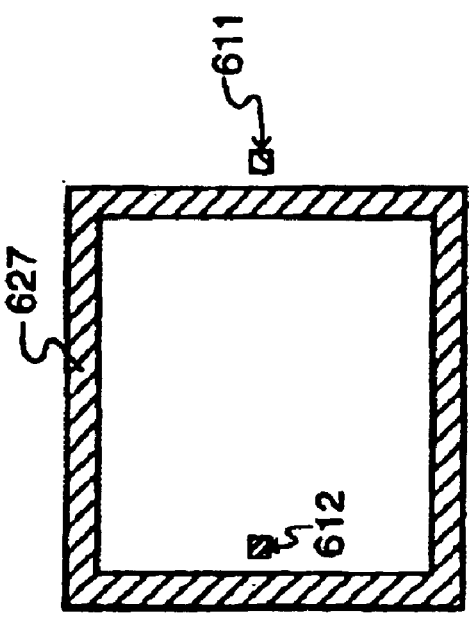
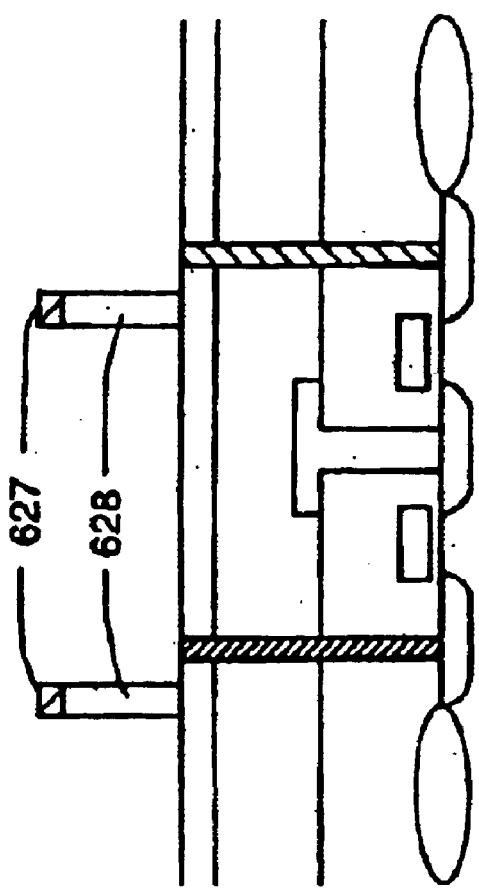
FIG. 6 H

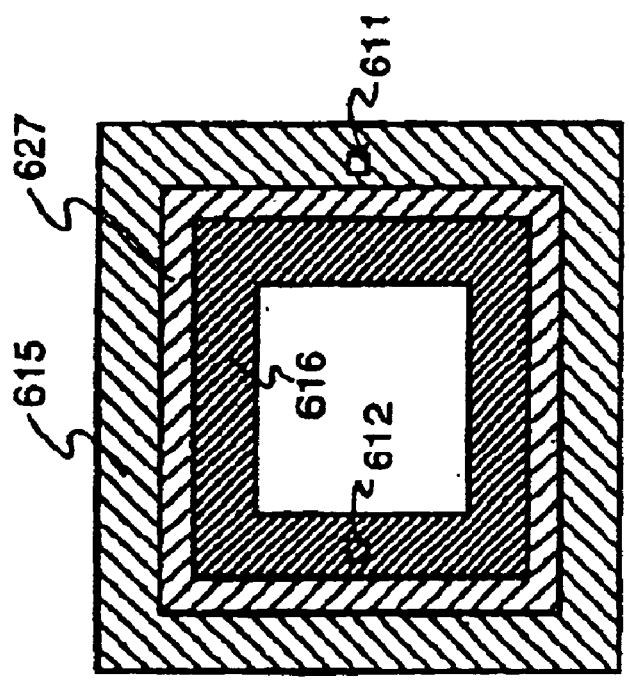
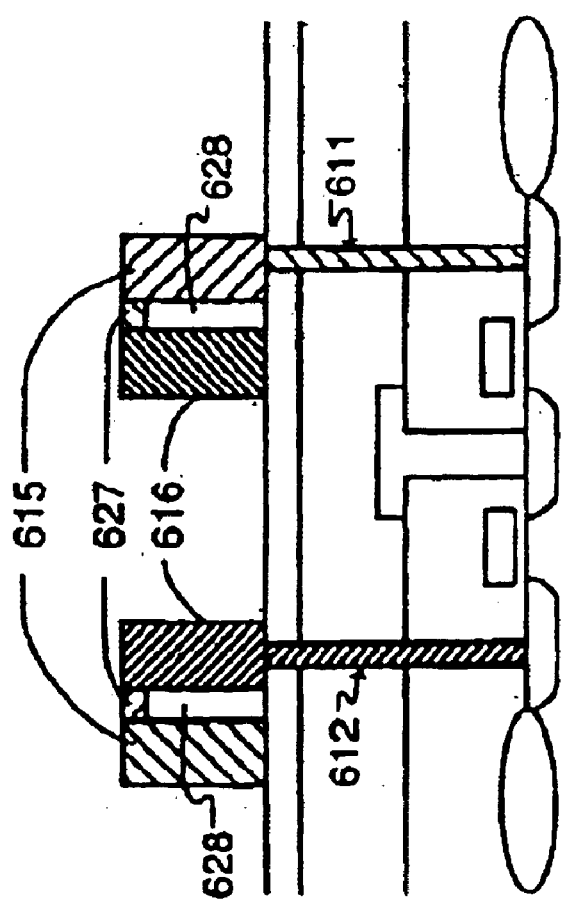
FIG. 61

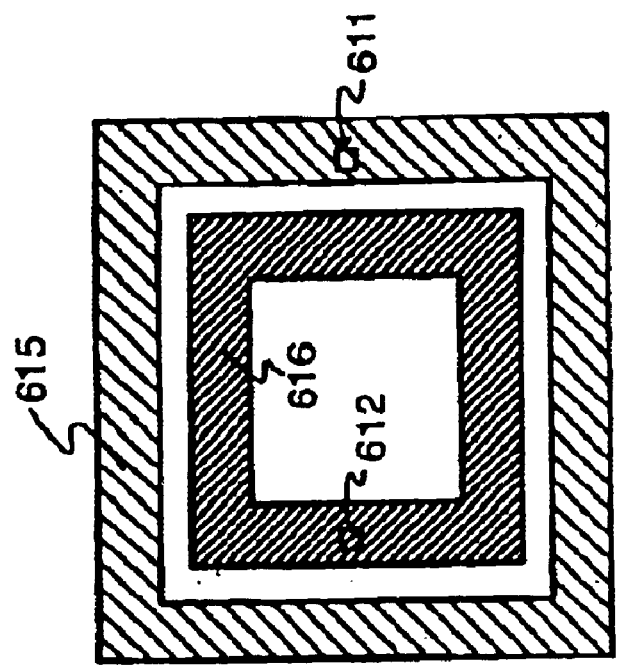
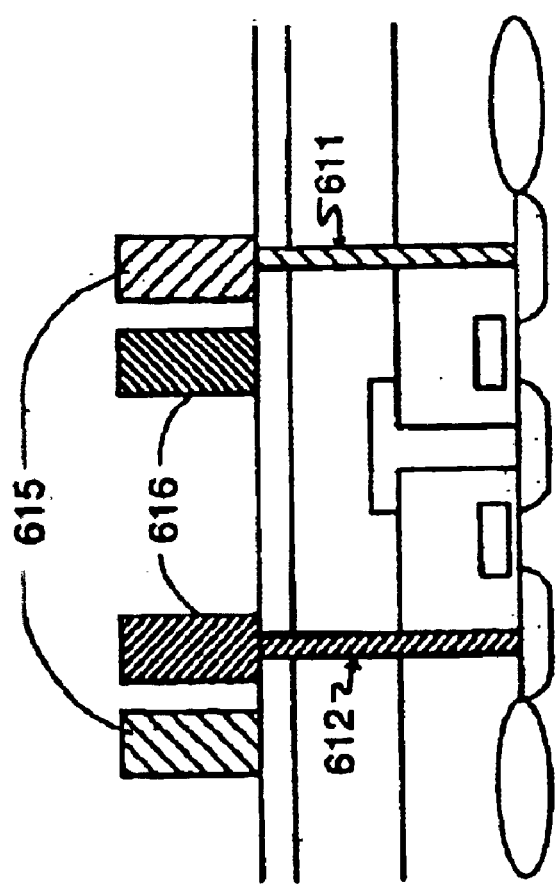
FIG. 6J

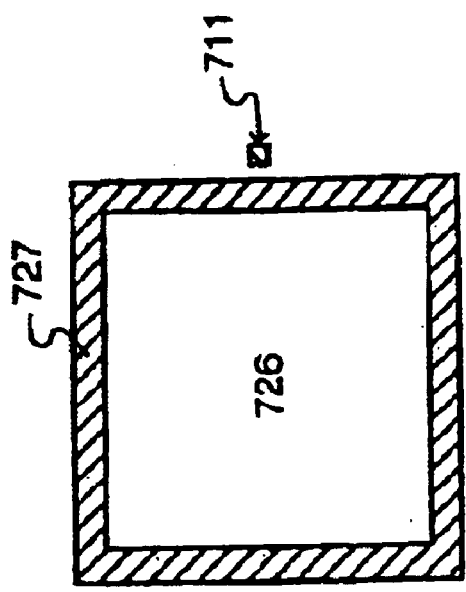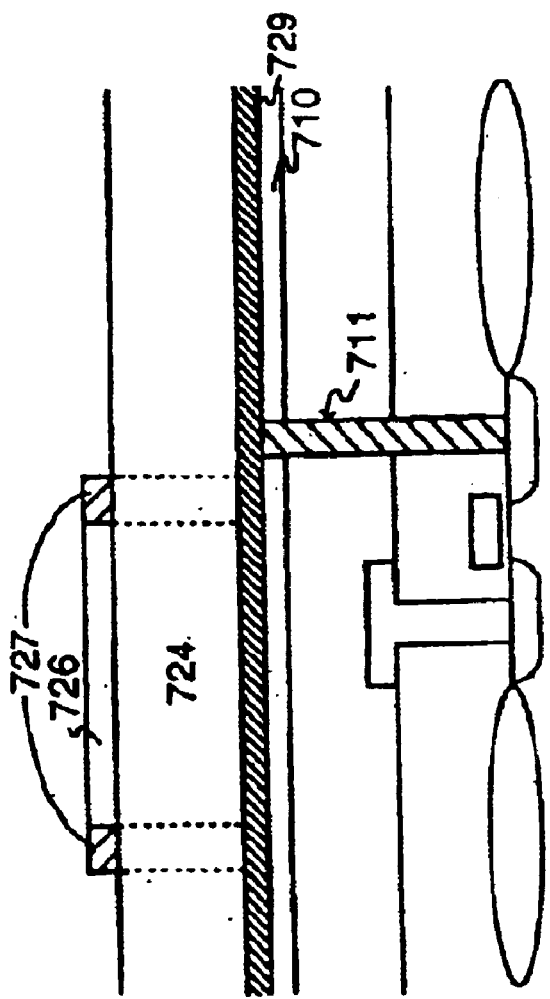
FIG. 7F

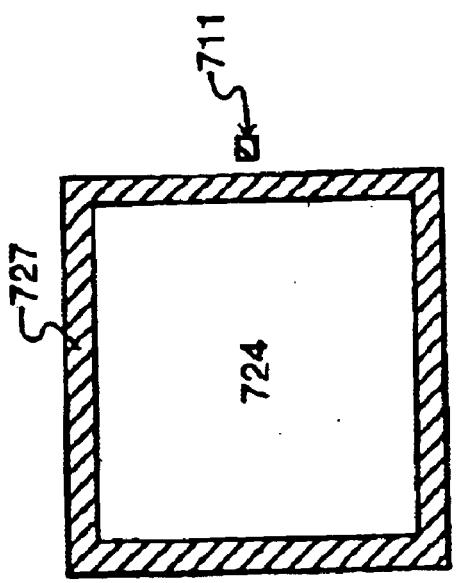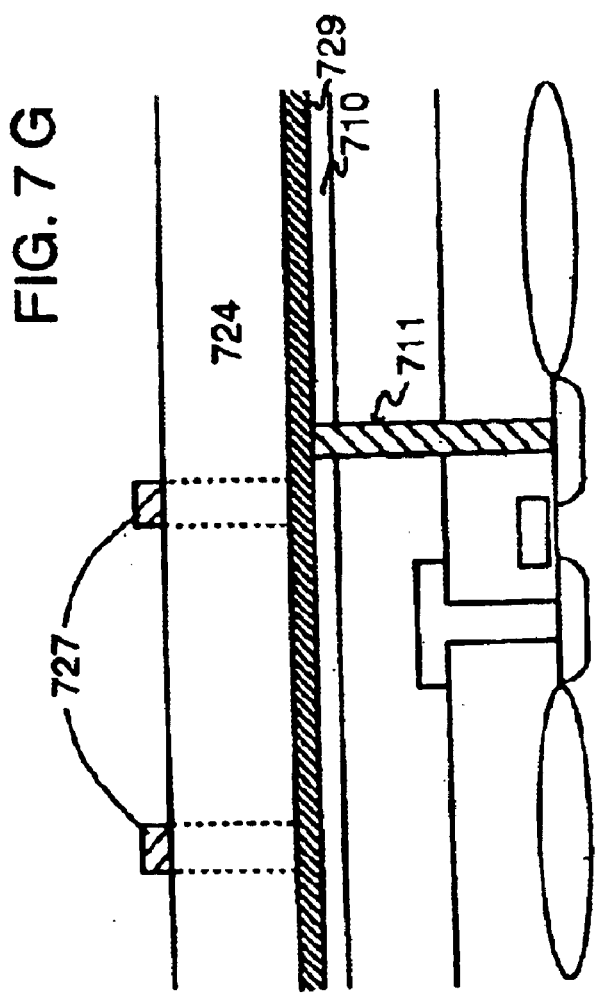
FIG. 7G

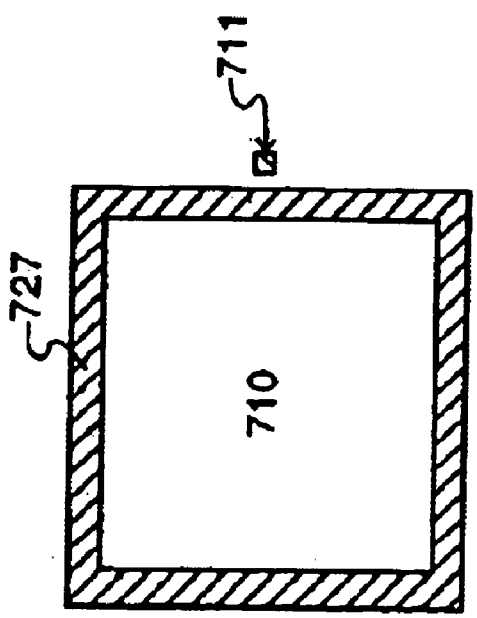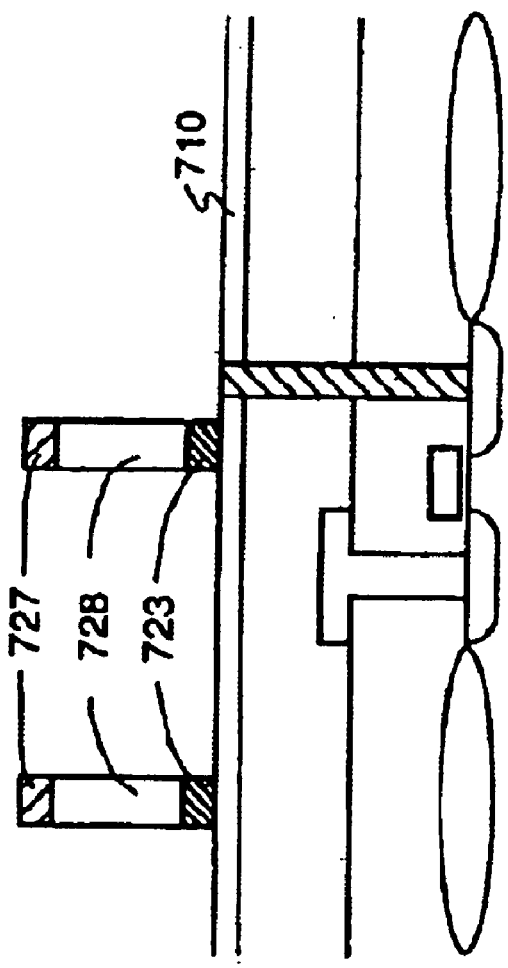
FIG. 7H

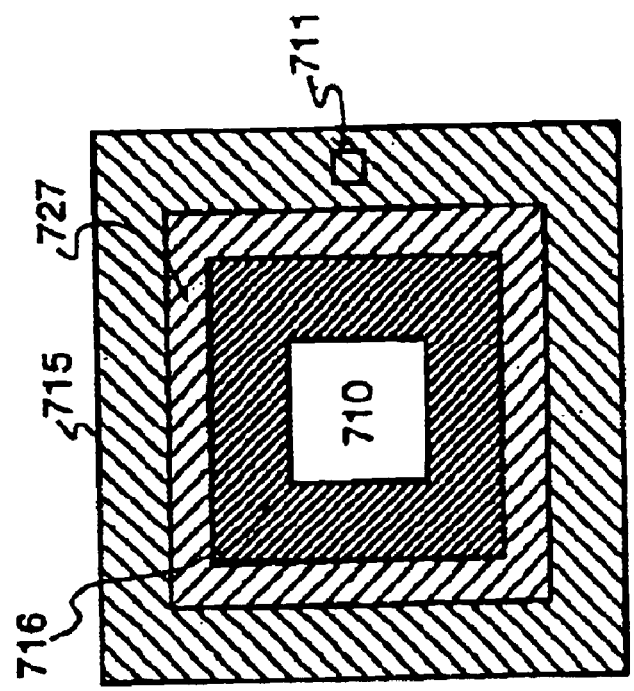
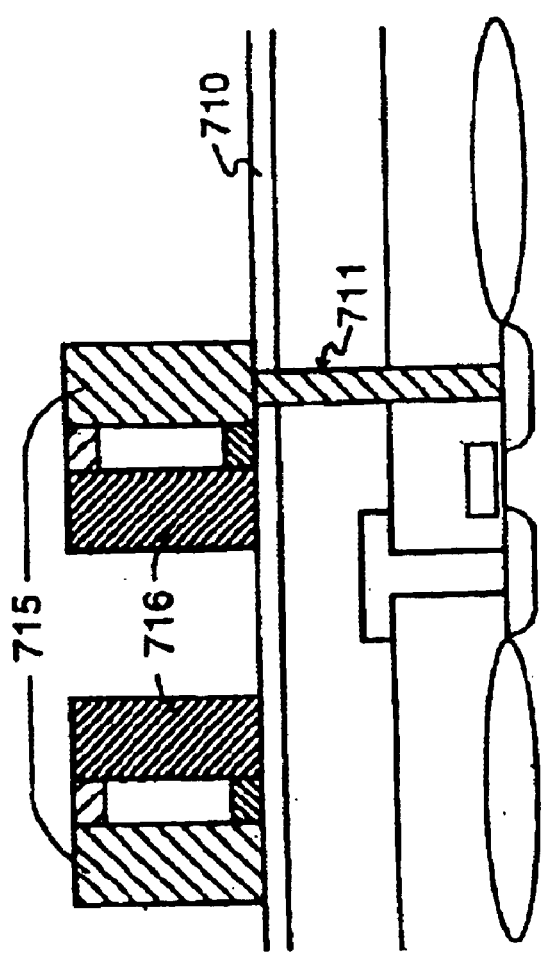
FIG. 71

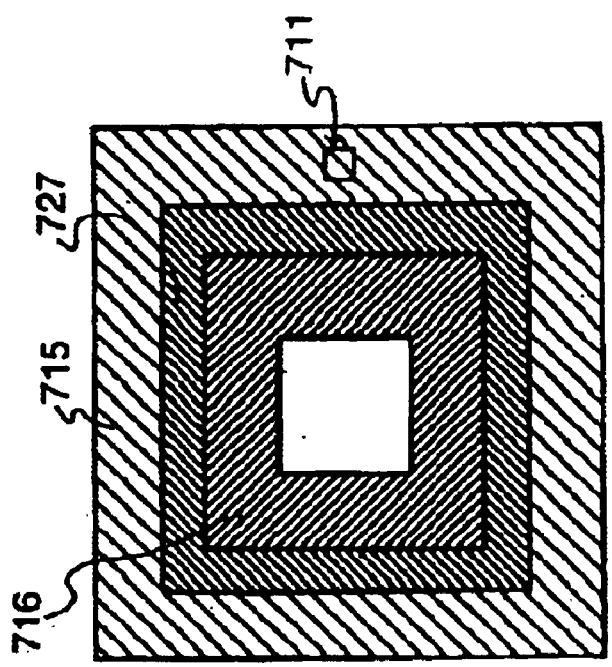
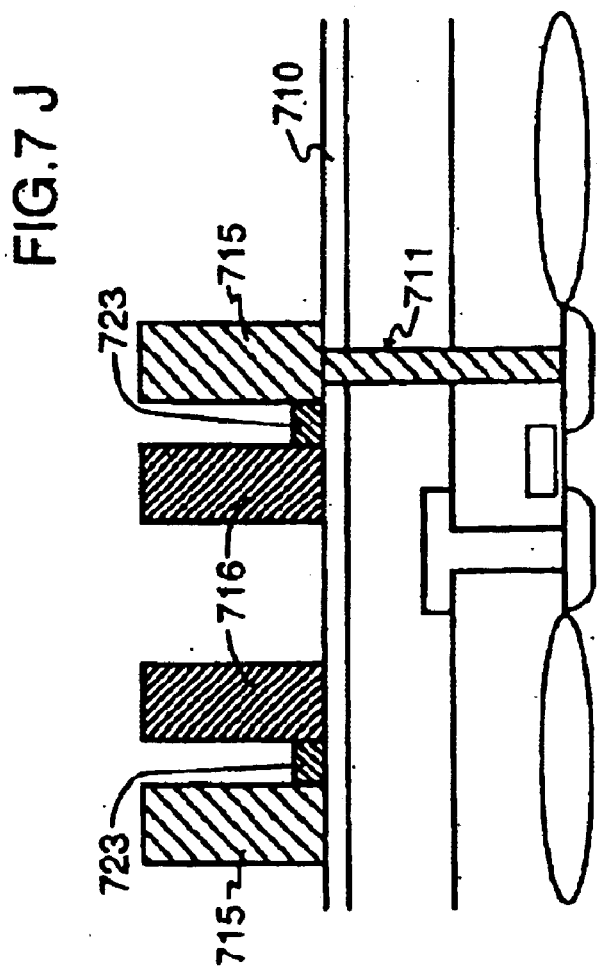
FIG. 7 J

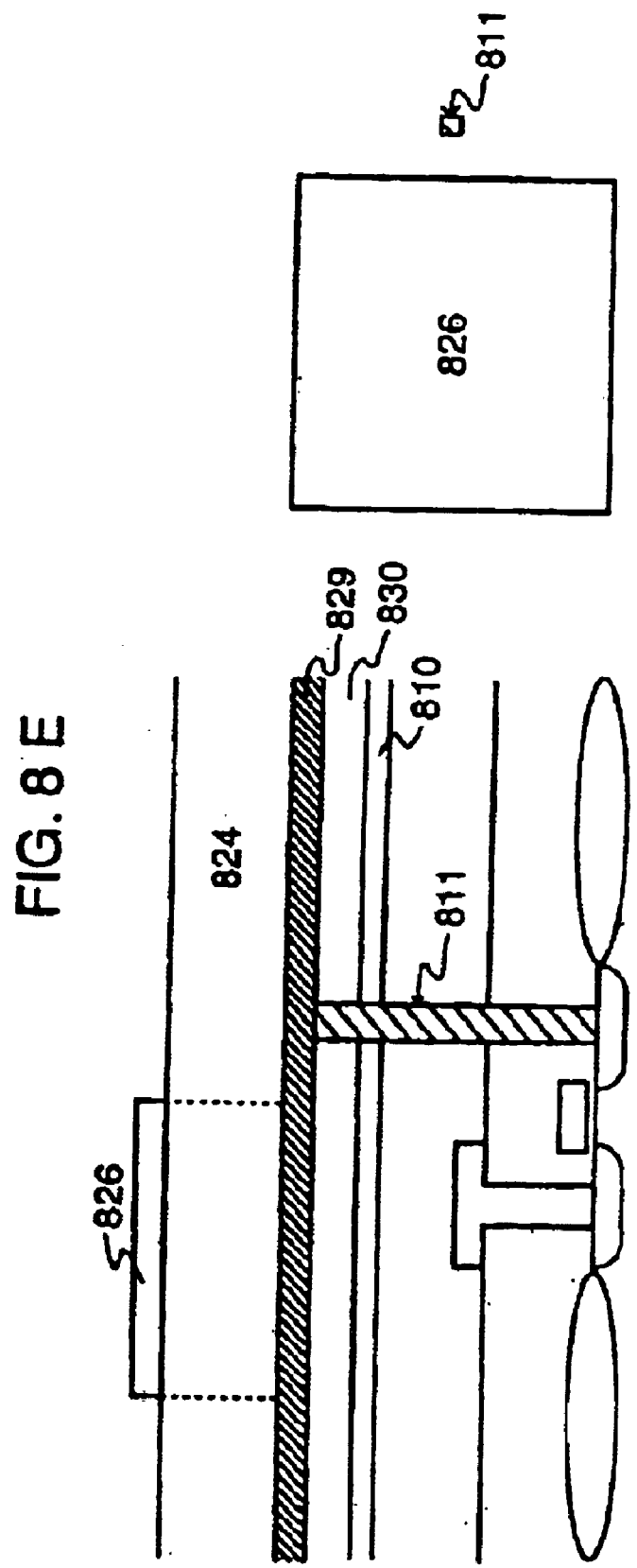

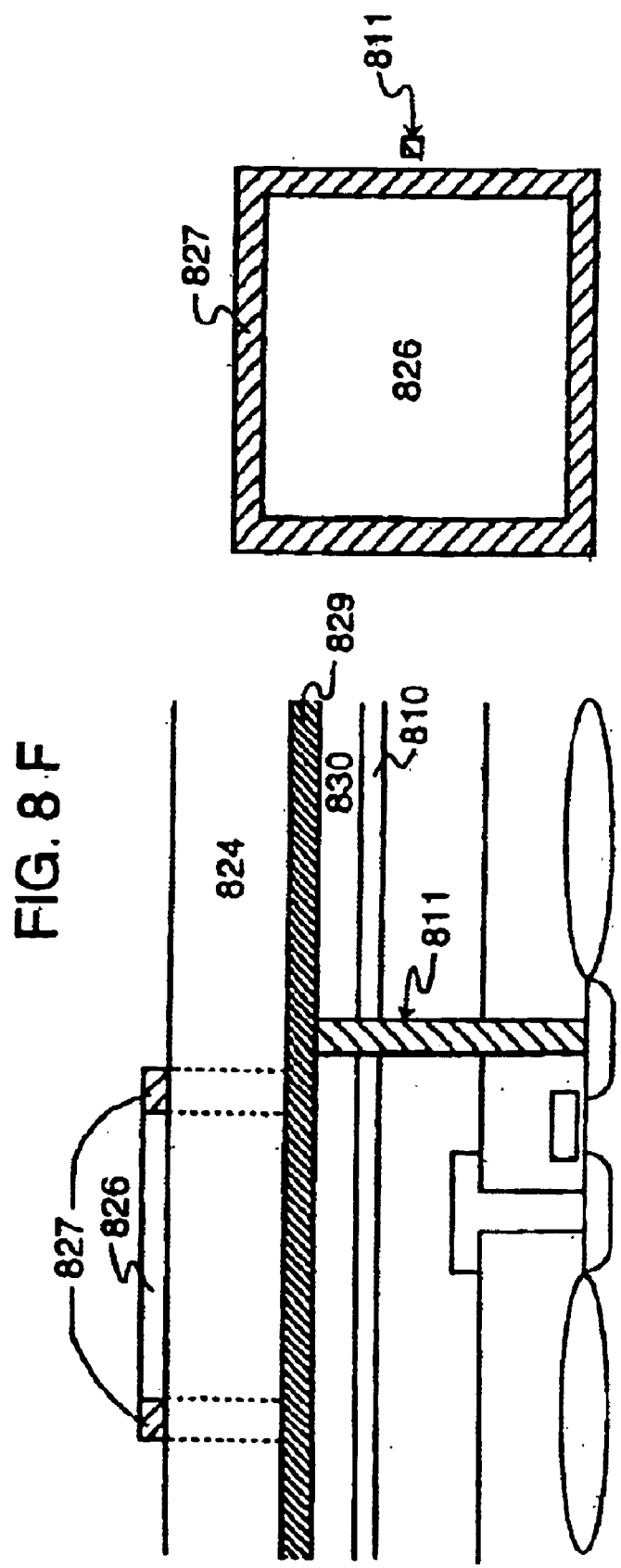
FIG. 8.F

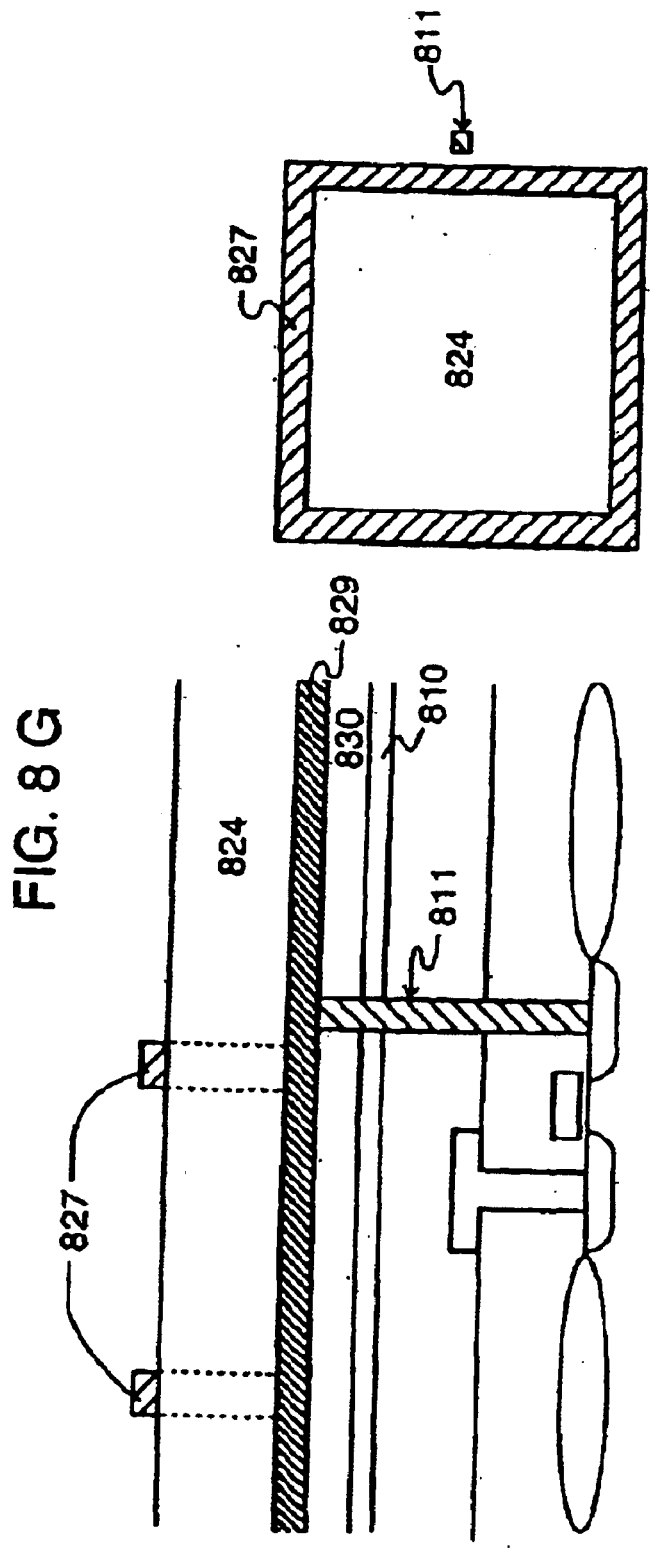

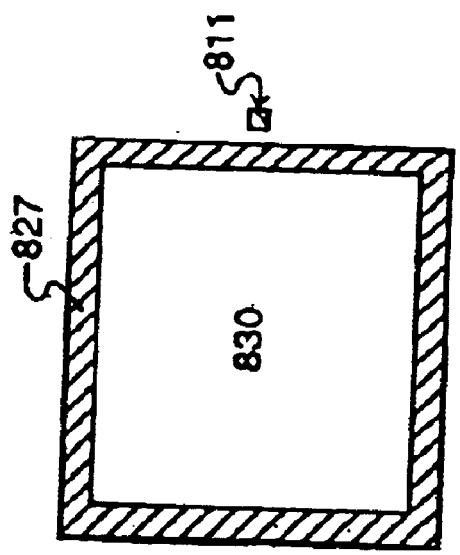
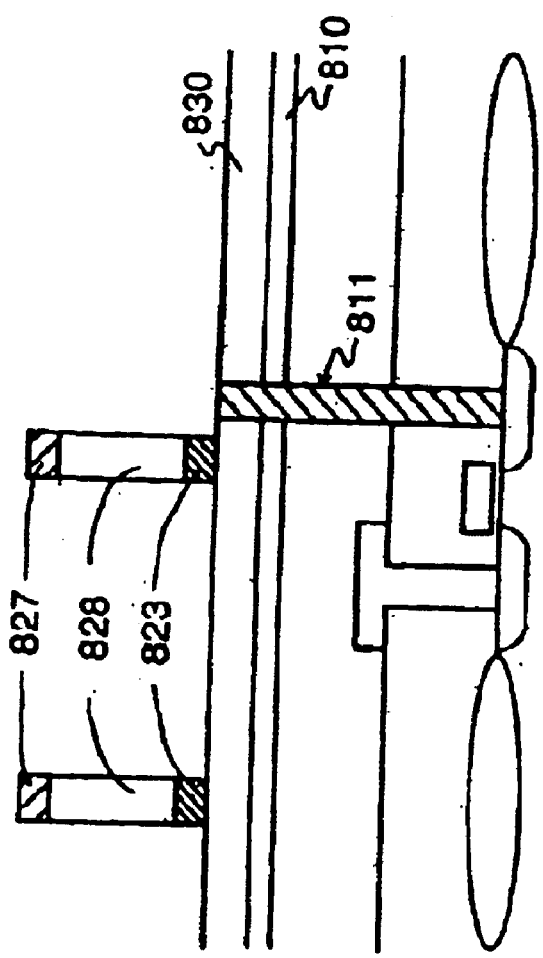
FIG. 8H

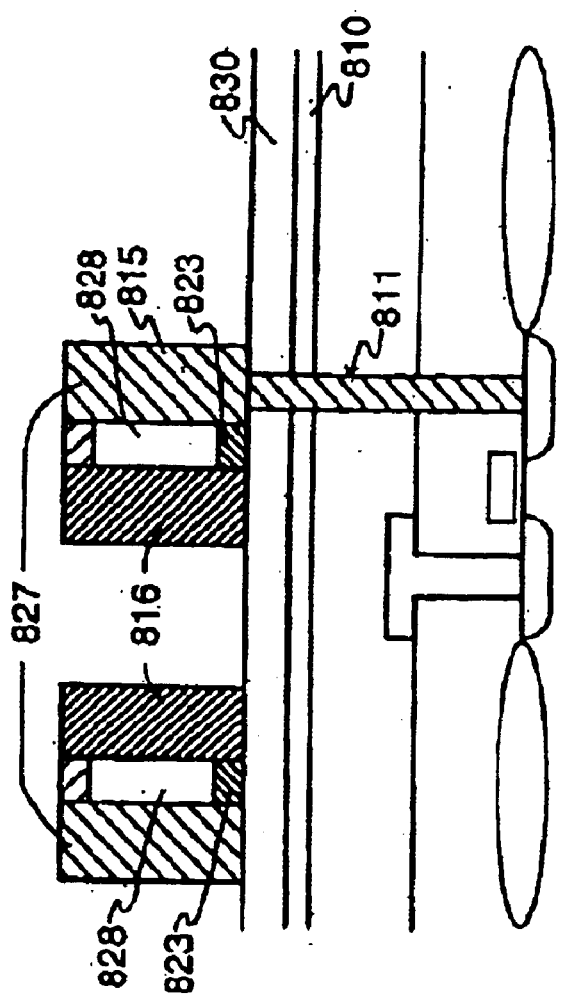
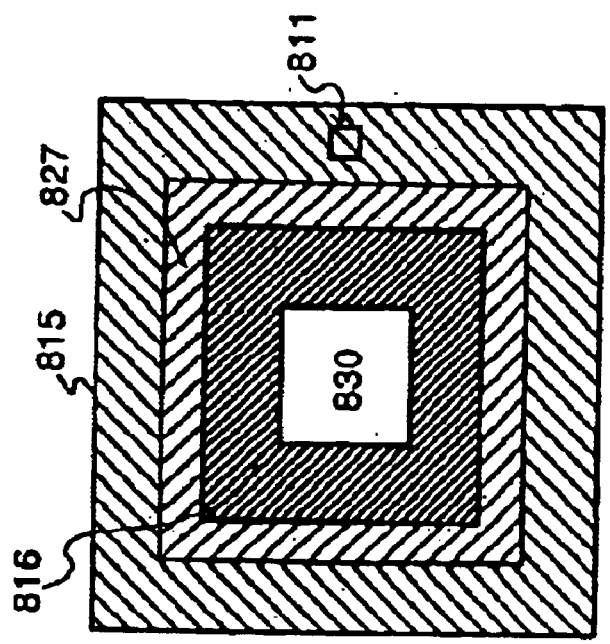
FIG. 81

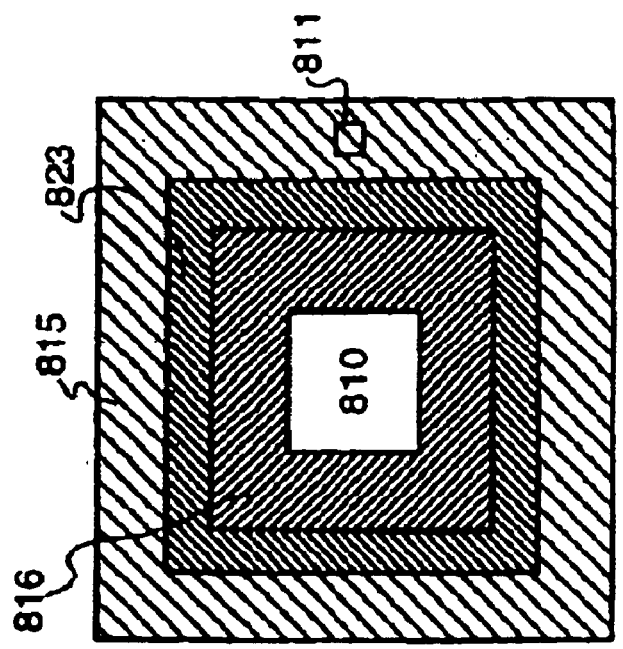
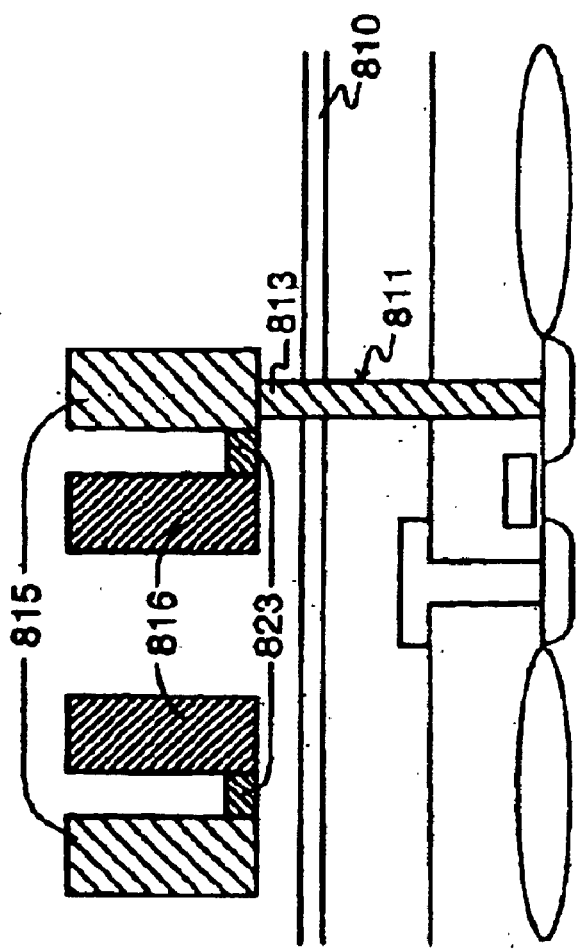
FIG. 8 J

SEMICONDUCTOR DEVICE AND METHOD OF FABRICATING THE SAME

CROSS-REFERENCE TO RELATED APPLICATIONS

This is a divisional of Application Ser. No. 09/225,547, filed Jan. 5, 1999 now U.S. Pat. No. 6,445,028 which is incorporated herein by reference in its entirety.

BACKGROUND OF THE INVENTION

1. Field of the Invention

The invention relates to a configuration of a capacitor of a semiconductor device such as a dynamic random access memory (DRAM) and a method of fabricating the same.

2. Related Art

There is proposed a capacitor having a cylindrical storage node for increasing electric-charge storage capacity (amount of electric charge to be stored therein, hereinafter simply referred to as charge storage capacity) as a capacitor of a semiconductor device such as a DRAM as disclosed in JP-A 2-226761, 3-232271, 6-177350 and 8-330539.

SUMMARY OF THE INVENTION

It is an object of the invention to provide a semiconductor device provided with a capacitor having a large charge storage capacity with high reliability.

It is another object of the invention to provide a method of fabricating a semiconductor device capable of restricting the increase in the number of fabricating steps.

To achieve above object of the invention, a semiconductor device of the first aspect of the invention comprises first and second transistors formed on a semiconductor substrate, a first capacitor composed of a first storage node connected to the first transistor, a capacitor insulating film and a self-plate, and a second capacitor composed of a second storage node connected to the second transistor, the capacitor insulating film and the self-plate, wherein the first storage node surrounds the periphery of the second storage node.

To achieve the another object of the invention, a method of fabricating a semiconductor device of the second aspect of the invention comprises a step of forming first and second transistors on a semiconductor substrate, a step of forming an insulating film on the first and second transistors, a step of defining a first opening in the insulating film formed on a source or a drain of the first transistor, a step of defining a second opening in the insulating film formed on a source or a drain of the second transistor, a step of embedding a conductive material in the first and second openings, a step of forming a mask pattern on the insulating film so as to cover the second opening, a step of forming a conductive film on inner and outer side walls of a first sacrificial film so that the conductive film is connected to the conductive material embedded in the first opening at an outer side wall of the mask pattern and connected to the conductive material embedded in the second opening inside the first sacrificial film, a step of forming first and second storage nodes by removing the mask pattern, a step of forming a capacitor insulating film on the insulating film so as to cover the first and second storage nodes, and a step of forming a self-plate on the capacitor insulating film.

PREFERRED EMBODIMENT OF THE INVENTION

Figure 1A:
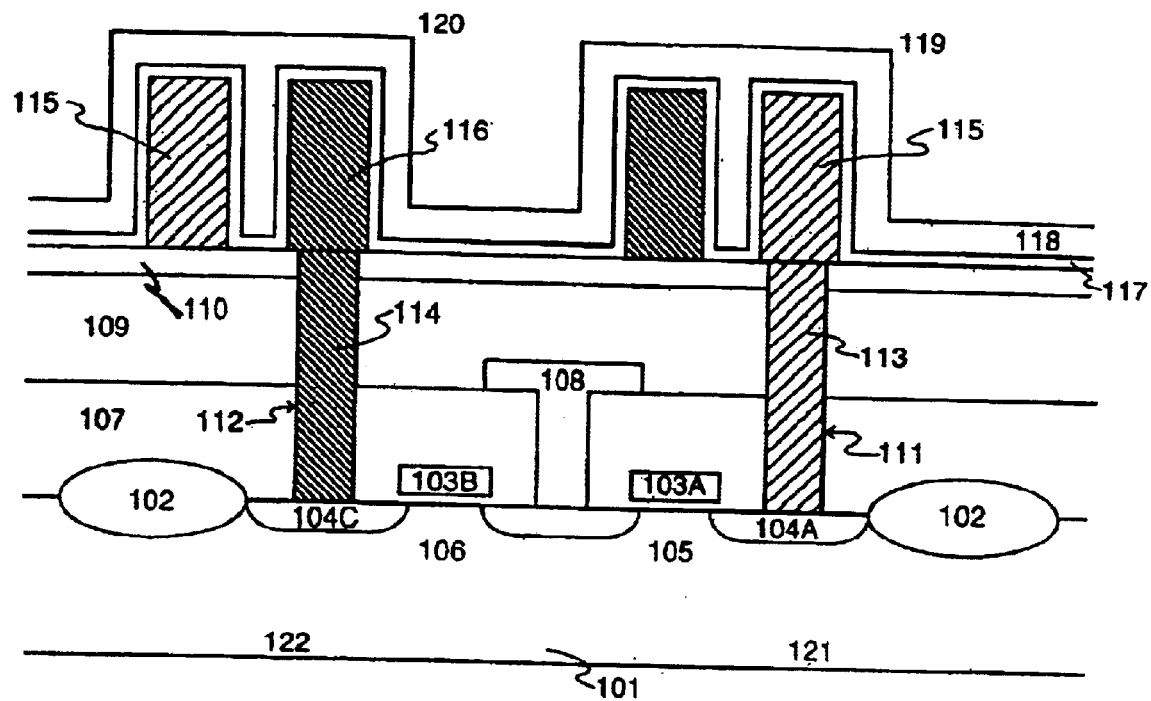
FIGS. 1A and 1B are sectional and plan views of a semiconductor device according to a first embodiment of the invention.

FIG. 1A is a sectional view of a semiconductor device according to a first embodiment of the invention.

A plurality of activation are as are formed on a semiconductor substrate 101 by forming field oxide films 102 on the semiconductor substrate 101. In some activation areas, there are formed a first transistor 105 composed of a gate electrode 103A, impurity diffusion layers 104A and 104B and a second transistor 106 composed of a gate electrode 103B and impurity diffusion layers 104B and 104C. A first interlevel insulating film 107 is formed on the semiconductor substrate 101 to cover the first and second transistors 105 and 106. A bit line 108 is formed by defining an opening in the first interlevel insulating film 107 and it is connected to the impurity diffusion layer 104B. A second interlevel insulating film 109 is formed on the first interlevel insulating film 107 to cover the bit line 108. A stopper nitride film 110 is formed on the second interlevel insulating film 109 to protect the second interlevel insulating film 109. A first contact hole 111 and a second contact hole 112 are respectively defined in the stopper nitride film 110, the first and second interlevel insulating films 107 and 109.

The impurity diffusion layer 104A is connected to a first storage node 115 of a first capacitor 119 to be formed later by way of the first contact hole 111. The impurity diffusion layer 104C is connected to a second storage node 116 of a second capacitor 120 to be formed later by way of the second contact hole 112. First and second polysilicon plugs 113 and 114 are respectively formed in the first and second contact holes 111 and 112. Formed on the stopper nitride film 110 is the cylindrical first storage node 115 made of polysilicon and connected to the first polysilicon plug 113 so as to surround the second contact hole 112. Formed also on the stopper nitride film 110 is a second storage node 116 made of polysilicon and connected to the second polysilicon plug 114 so as to be surrounded by the first storage node 115. A capacitor nitride film 117 is formed on the stopper nitride film 110 to cover the first and second storage nodes 115 and 116. A self-plate 118 made of polysilicon is formed on the capacitor nitride film 117. A first capacitor 119 is composed of the first storage node 115, the capacitor nitride film 117 and the self-plate 118. A second capacitor 120 is composed of the second storage node 116, the capacitor nitride film 117 and the self-plate 118. A first memory cell 121 is composed of the first transistor 105 and the first capacitor 119 while a second memory cell 122 is composed of the second transistor 106 and the second capacitor 120.

Figure 1B:
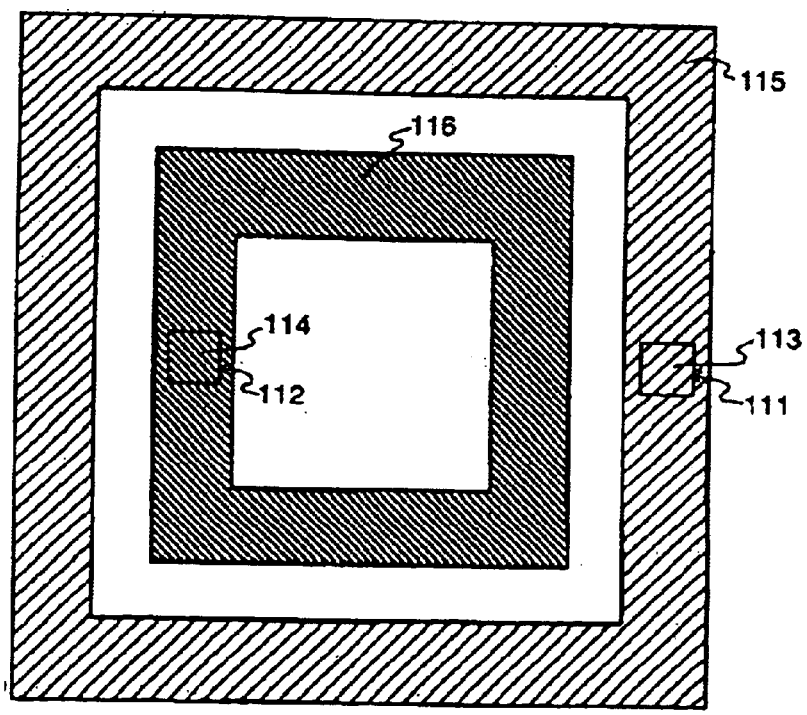

FIG. 1B is a plan view showing the first and second storage nodes 115 and 116 of the semiconductor device according to the first embodiment of the invention.

The first and second storage nodes 115 and 116 are respectively cylindrically formed on the stopper nitride film 110 wherein the first storage node 115 is formed to surround the second storage node 116. The first storage node 115 is formed cylindrically to extend not only to the area on which the first transistor 105 is formed but also to the area on which the second transistor 106 is formed. The second storage node 116 is formed cylindrically to extend not only to the area on which the second transistor 106 is formed but also to the area on which the first transistor 105 is formed.

In the semiconductor device formed as mentioned above, the first and second storage nodes 115 and 116 are formed cylindrically. Further, the first storage node 115 is formed to surround the second storage node 116 and to extend to the areas on which the first and second transistors 105 and 106 are formed while the second storage node 116 is formed in the area on which the first storage node 115 is formed and to extend to the areas on which the first and second transistors 105 and 106 are formed. That is, the first and second storage nodes 115 and 116 are respectively formed by effectively utilizing the areas on which capacitors are formed. Accordingly, the surface areas of the first and second storage nodes 115 and 116 of the first and second capacitors 119 and 120 contributing to the charge storage can be increased, thereby sufficiently securing the charge storage capacity. It is therefore possible to obtain a high reliable semiconductor device adapted for high integration.

Also in the first embodiment, there occurs a difference between the surface areas of the first and second storage nodes 115 and 116 contributing to the charge storage. However, if the surface area of the second storage node 116 contributing to the charge storage and surrounded by the first storage node 115 is limited to the minimum size necessary for charge storage, the surface area of the first storage node contributing to the charge storage becomes larger than that of the second storage node, so that it is considered that there does not occur a serious problem in the operation of the semiconductor device even if there occurs the difference between charge storage capacities of two capacitors.

Meanwhile, if charge storage capacities of the two capacitors are made equal to each other, the constructions of the following second and third embodiments of the invention are considered.

Figure 2:
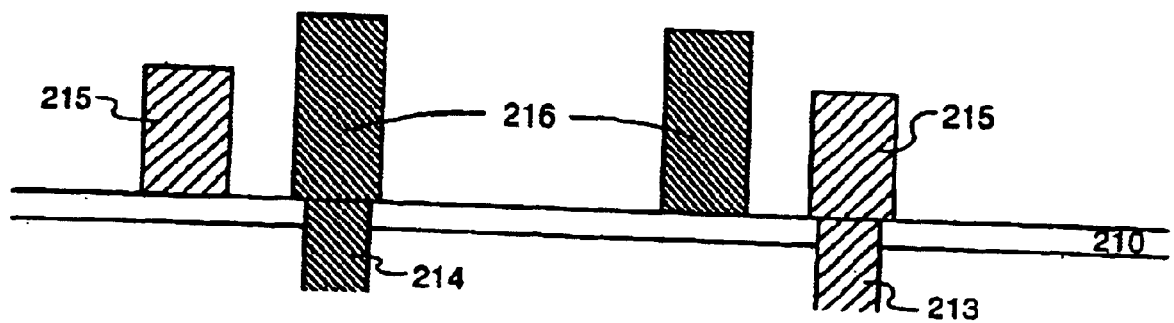
FIGS. 2A and 2B are sectional and plan views of a semiconductor device according to a second embodiment of the invention.
Figure 2:
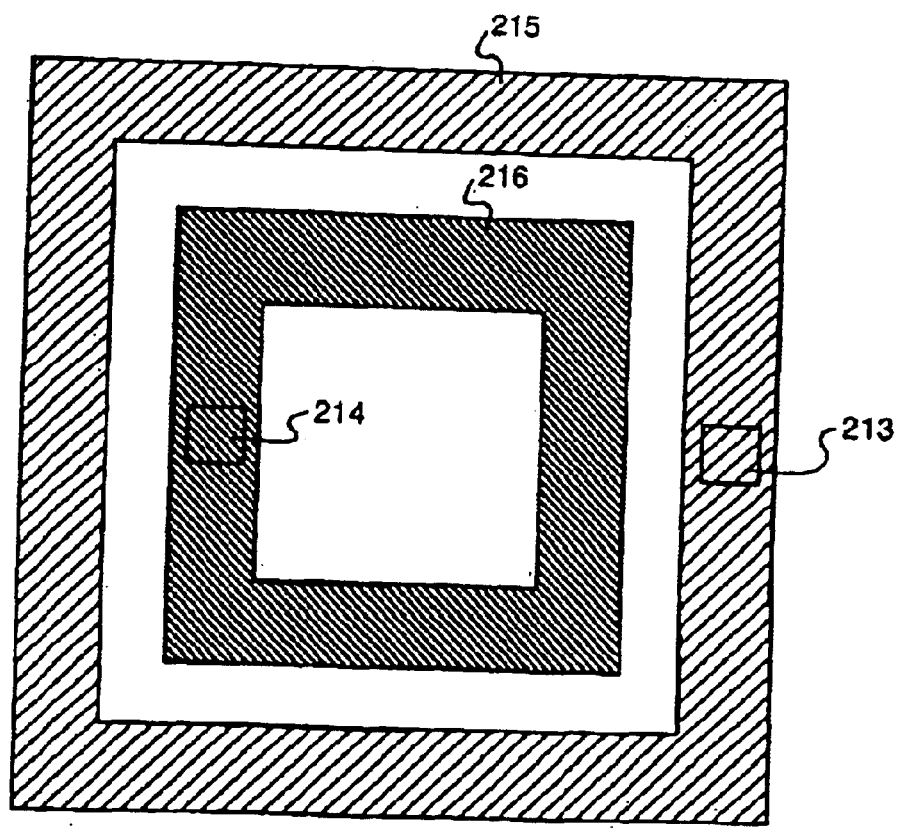

FIGS. 2A and 2B are sectional and plan views of storage nodes of capacitors in a semiconductor device according to the second embodiment of the invention. In FIGS. 2A and 2B, the constructions of the transistor, the bit line, the interlevel insulating film, the capacitor nitride film, the self-plate, and the like are the same as those of the first embodiment, and hence they are omitted.

In the second embodiment, surface areas of first and second storage nodes 215 and 216 contributing to the charge storage are equal to each other by changing the configuration of the first storage node 115 of the first embodiment. That is, as shown in FIG. 2A, the height of the cylindrical first storage node 215 is lower than that of the second cylindrical storage node 216. Accordingly, the surface area of the first storage node 215 contributing to the charge storage is smaller than the case where the heights of the first and second storage nodes 215 and 216 are equal to each other by difference of height between the heights of the first and second storage nodes 215 and 216. Alternatively, the height of the second storage node 216 may be higher than that of the first storage node 215.

As mentioned above, the charge storage capacity of each capacitor can be sufficiently secured because the storage nodes are cylindrically formed. Further, if the height of the first storage node formed outward is lower than that of the second storage node formed inward, the charge storage capacity of each capacitor becomes equal.

Figure 3:
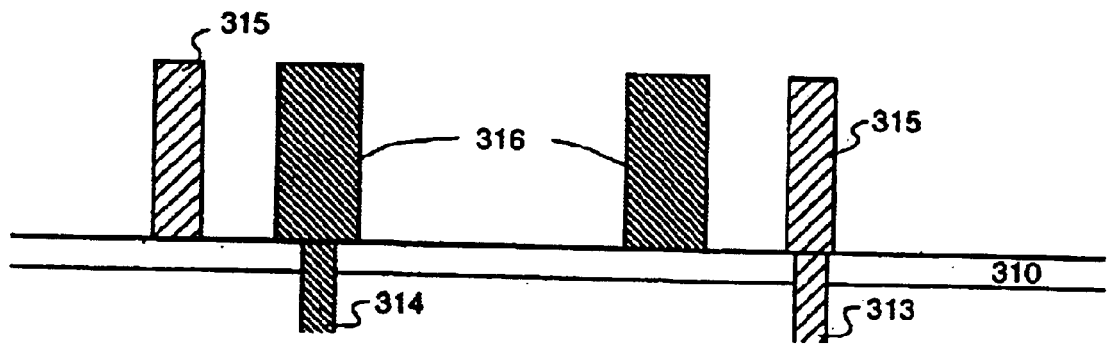
FIGS. 3A and 3B are sectional and plan views of a semiconductor device according to a third embodiment of the invention.
Figure 3:
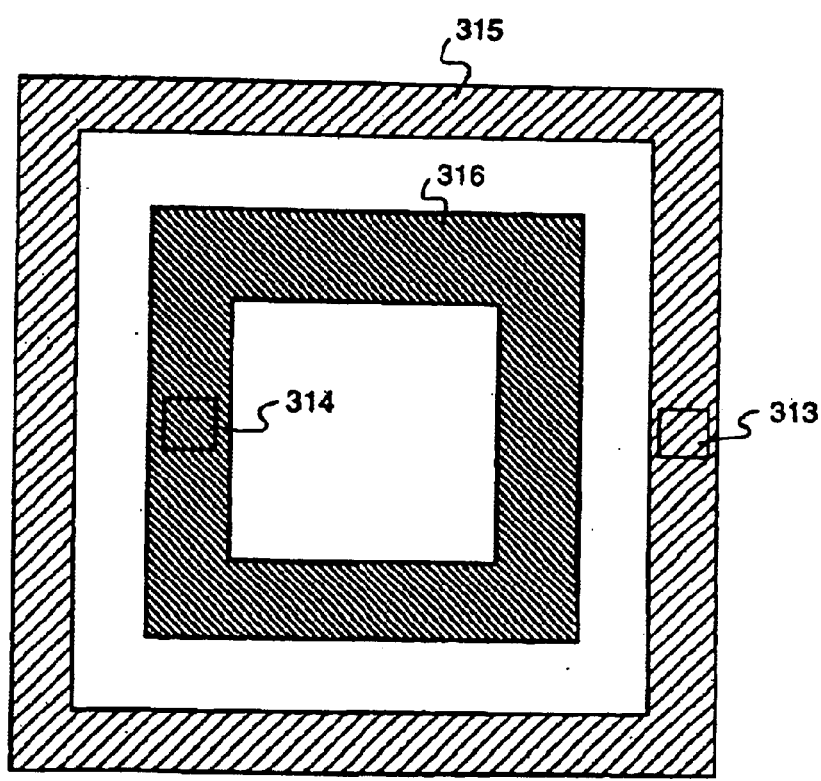

FIGS. 3A and 3B are sectional and plan views of storage nodes of capacitors of a semiconductor device according to a third embodiment of the invention.

In FIGS. 3A and 3B, the constructions of the transistor, the bit line, the interlevel insulating film, the capacitor nitride film, the self-plate, and the like are the same as those of the first embodiment, and hence they are omitted In the third embodiment, the thickness of a cylindrical first storage node 315 is thinner than that of a second cylindrical storage node 316 so that the surface areas of the first and second storage nodes 315 and 316 contributing to the charge storage become equal to each other. The surface area of the first storage node 315 contributing to the charge storage is smaller than the case where the thicknesses of the first and second storage nodes 315 and 316 are equal to each other by the thin thickness of the first storage node 315. Alternatively, the thickness of the second storage node 316 may be thicker than that of the first storage node 315.

As explained above, since the storage nodes are cylindrically formed, the charge storage capacities of the capacitors are sufficiently secured. If the thickness of the first storage node 315 is thinner than that of the second storage node 316, the charge storage capacities of the capacitors become equal.

Figure 4:
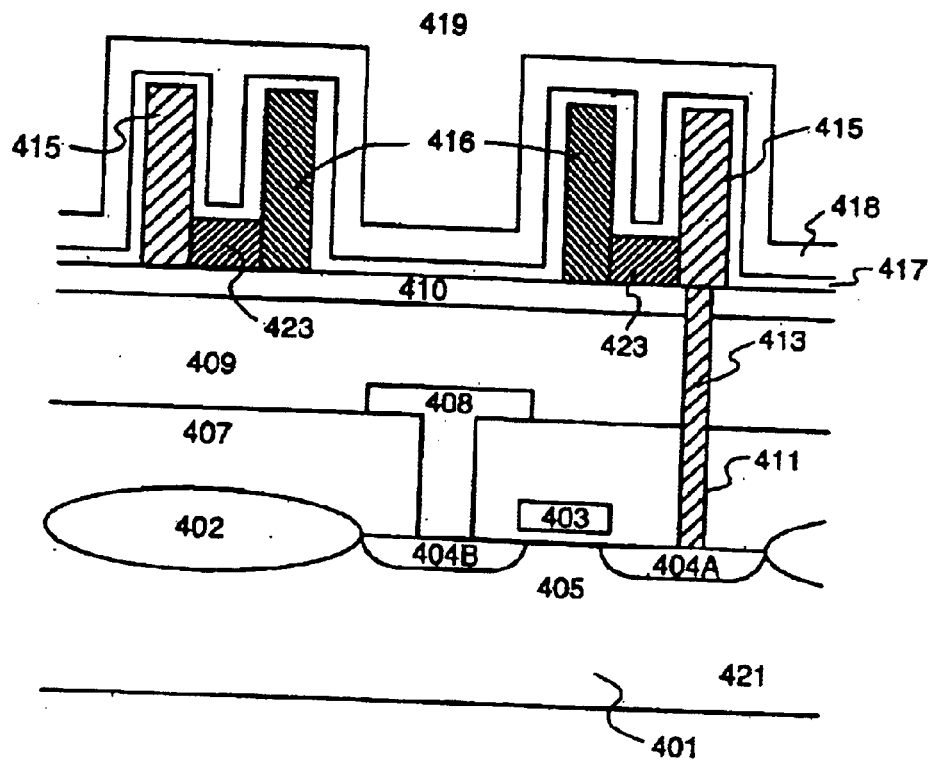
FIGS. 4A and 4B are sectional and plan views of a semiconductor device according to a fourth embodiment of the invention.
Figure 4:
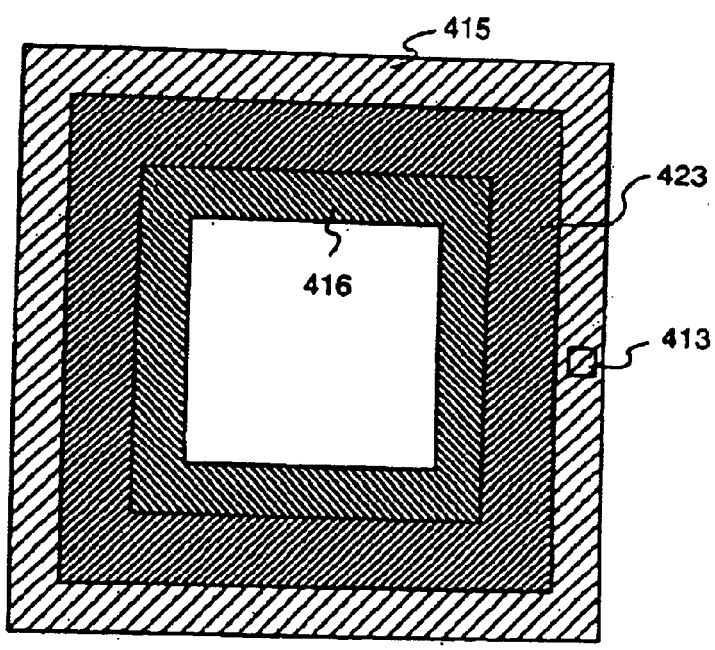

FIGS. 4A and 4B are sectional and plan views of storage nodes of capacitors in a semiconductor device according to a fourth embodiment of the invention.

In the fourth embodiment, the first and second storage nodes 115 and 116 of the first embodiment are connected integrally to each other so that the second storage node 116 serves as an electrode contributing to the charge storage of each capacitor of the first memory cell 121.

A plurality of activation areas are formed on a semiconductor substrate 401 by forming field oxide films 402 on a semiconductor substrate 401. Formed on some area is a first transistor 405 composed of a gate electrode 403, and impurity diffusion layers 404A and 404B.

A first interlevel insulating film 407 is formed on the semiconductor substrate 401 to cover the first transistor 405. A bit line 408 is formed by defining an opening in the first interlevel insulating film 407 and it is connected to the impurity diffusion layer 404B. A second interlevel insulating film 409 is formed on the first interlevel insulating film 407 and the bit line 408 is covered with the second interlevel insulating film 409. A stopper nitride film 410 for protecting the second interlevel insulating film 409 is formed on the second interlevel insulating film 409. A first contact hole 411 is defined in the stopper nitride film 410, and the first and second interlevel insulating films 407 and 409. The impurity diffusion layer 404A and a first polysilicon plug 413 of a capacitor nitride film 417, to be formed later, are connected to each other by way of the first contact hole 411.

The first polysilicon plug 413 is formed in the first contact hole 411. Formed on the stopper nitride film 410 are a first cylindrical storage node 415 made of polysilicon and connected to the first polysilicon plug 413, a second cylindrical storage node 416 surrounded by the first cylindrical storage node 415 and a third storage node 423 for connecting the first and second storage nodes 415 and 416. The third storage node 423 is formed between the first cylindrical storage node 415 and the second cylindrical storage node 416. A capacitor nitride film 417 is formed on the stopper nitride film 410 to cover the first, second and third storage nodes 415, 416 and 423. A self-plate 418 made of a polysilicon film is formed on the capacitor nitride film 417. A first capacitor 419 is constituted by the first, second and third storage nodes 415, 416 and 423, the capacitor nitride film 417 and the self-plate 418. A first memory cell 421 is constituted by the first transistor 405 and the first capacitor 419.

As mentioned above, in the fourth embodiment, the storage nodes of one capacitor are formed when the first and second storage nodes 415 and 416 of capacitors are integrally connected to each other by the third storage node 423.

Further, the surface area of the third storage node 423 except the connecting surface between itself and first and second storage nodes 415 and 416 and between itself and the stopper nitride film 410 contributes to the charge storage. Accordingly, the charge storage capacity of each capacitor of one memory cell increases. Accordingly, a charge storage capacity having sufficient tolerance to a soft error is secured, thereby obtaining a semiconductor device having high reliability.

Figure 5:
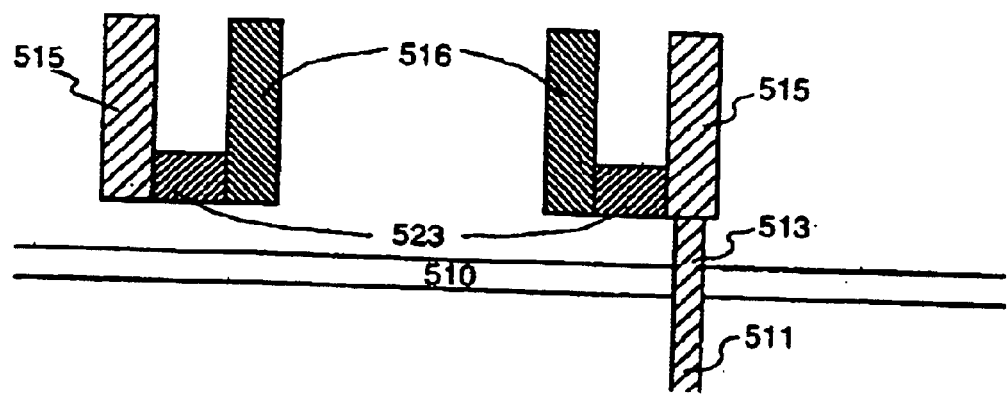
FIGS. 5A and 5B are sectional and plan views of a semiconductor device according to a fifth embodiment of the invention.
Figure 5:
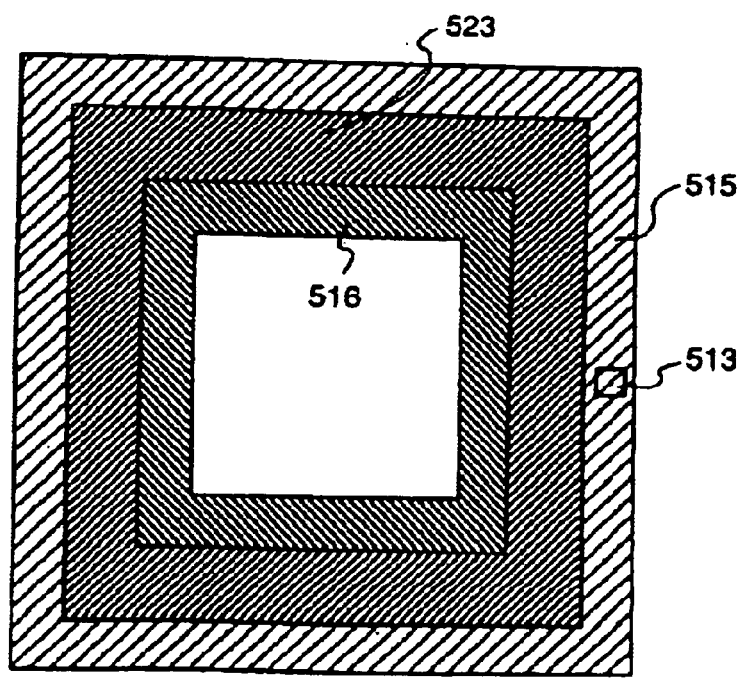

FIGS. 5A and 5B are sectional and plan views of storage nodes of capacitors in a semiconductor device according to a fifth embodiment of the invention.

In FIGS. 5A and 5B, the constructions of the transistor, the bit line, the interlevel insulating film, and the like are the same as those of the fourth embodiment, and hence they are omitted.

In the fifth embodiment, the charge storage capacity of one capacitor increases by spacing the first, second and third storage nodes 415, 416 and 423 away from the stopper nitride film 410 in the fourth embodiment. In the fifth embodiment, a first polysilicon plug 513 formed by being embedded into a first contact hole 511 protrudes from the surface of a stopper nitride film 510. A first cylindrical storage node 515 is formed on the protruded first polysilicon plug 513. A second storage node 516 is cylindrically formed to be surrounded by the first storage node 515. The first and second storage nodes 515 and 516 are connected to each other by way of a third storage node 523. The first, second and third storage nodes 515, 516 and 523 are respectively formed by being spaced away from the stopper nitride film 510. Formed on the stopper nitride film 510 are a capacitor nitride film and a self-plate, not shown, subsequently so as to cover the first, second and third storage nodes 515, 516 and 523, and the first polysilicon plug 513.

As explained above, in the fifth embodiment, the first polysilicon plug 513 is protruded from the surface of the stopper nitride film 510 and the first, second and third storage nodes 515, 516 and 523 are formed by being spaced away from the stopper nitride film 510. Accordingly, the surface areas contacting the capacitor nitride film 517 of those of the first, second and third storage nodes 515, 516 and 523 and the first polysilicon plug 513 increases compared with the surface areas in the fourth embodiment. As a result, the charge storage capacity of each capacitor increases, securing storage capacity necessary for tolerance to a soft error. That is, a high reliable semiconductor adapted for high integration is obtained.

FIGS. 6A to 6J respectively show a method of fabricating a semiconductor device according to a sixth embodiment of the invention. The sixth embodiment relates to a method of fabricating the semiconductor device as explained in the first embodiment.

Figure 6:
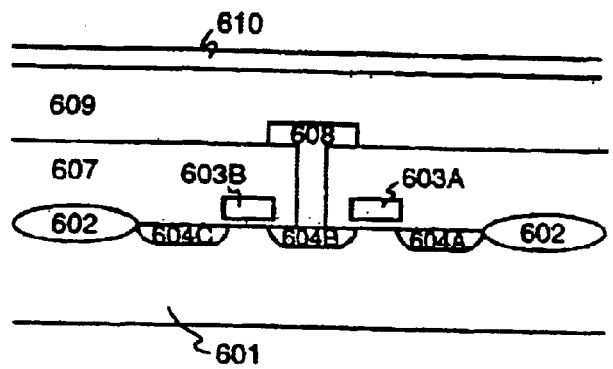
FIGS. 6A to 6J are respectively sectional views and plan views showing a method of fabricating a semiconductor device according to a sixth embodiment of the invention.
Figure 6:
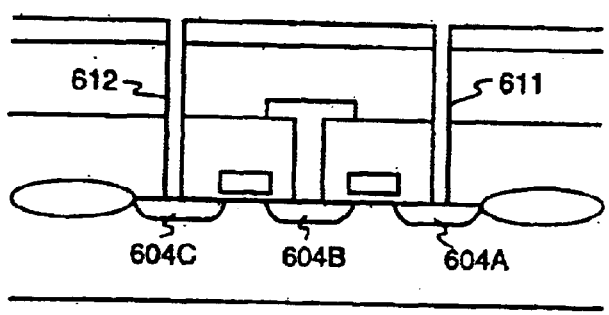
Figure 6:
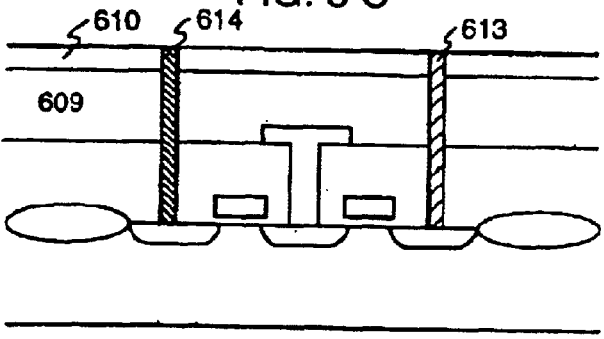
Figure 6:
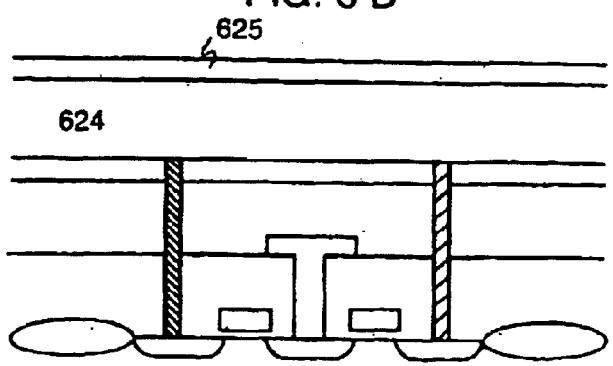

As shown in FIG. 6A, field oxide films 602 for partitioning activation areas are formed on a semiconductor substrate 601 in the thickness of 2000~5000 Å by a normal LOCOS (Local Oxidation of Silicon) method. Formed on the activation areas are a first transistor 605 composed of a gate electrode 603A and impurity diffusion layers 604A and 604B and a second transistor 606 composed of a gate electrode 603B and impurity diffusion layers 604B and 604C. Thereafter, an oxide film or a BPSG film are deposited on the entire surface in the thickness of 1000~5000 Å by a CVD method, thereby forming a first interlevel insulating film 607. A contact hole is formed in the first interlevel insulating film 607 to expose the impurity diffusion layer 604B, and a bit line 608 is formed to be embedded in the contact hole. Thereafter, a second interlevel insulating film 609 is formed on the entire surface by depositing the oxide film or the BPSG film in the thickness of 1000~5000 Å by a CVD method. A stopper nitride film 610 is formed by depositing a nitride film on the second interlevel insulating film 609 in the thickness of 200~1000 Å to protect the second interlevel insulating film 609 against an etching process.

Next, as shown in FIG. 6B, first and second contact holes 611 and 612 are formed to expose the impurity diffusion layers 604A and 604C by normal photolithographic and etching techniques.

Then, as shown in FIG. 6C, polysilicon is deposited on the entire surface to be embedded in the first and second contact holes 611 and 612 by a CVD method. Impurities such as phosphorus or the like are introduced into polysilicon to enhance the conductivity of polysilicon. Thereafter, polysilicon other than polysilicon embedded in the first and second contact holes 611 and 612 is removed by etching. As a result, first and second polysilicon plugs 613 and 614 are respectively formed in the first and second contact holes 611 and 612. At this time, since the stopper nitride film 610 serves as a film to stop the etching, the second interlevel insulating film 609 is prevented from being etched.

Then, as shown in FIG. 6D, a sacrificial film 624 for forming cylindrical storage nodes of capacitors are formed by depositing the oxide film or the BPSG film in the thickness of 2000~8000 Å by a CVD method. Thereafter, a polysilicon film 625 is deposited on the sacrificial film 624 in the thickness of 1000~3000 Å by a CVD method.

Then, as shown in a sectional view of FIG. 6E, a mask polysilicon 626 is formed by subjecting the polysilicon film 625 to patterning by normal photolithographic and etching techniques. At this time, as shown in a plan view of FIG. 6E, the patterning of the polysilicon film 625 is performed so as to cover the second contact hole 612.

Next, as shown in a sectional view of FIG. 6F, a nitride film is deposited on the sacrificial film 624 and mask polysilicon 626 in the thickness of 1000~2000 Å by a CVD method, then a mask nitride film 627 is formed by rendering the nitride film to remain on the side wall alone of the mask polysilicon 626 by a reactive ion etching (RIE). At this time, as shown in the plan view of FIG. 6F, the mask nitride film 627 is formed not to surround the first contact hole 611 but surround the second contact hole 612.

Then, as shown in FIG. 6G, the mask polysilicon 626 is removed by a normal etching technique.

Then, as shown in FIG. 6H, the sacrificial film 624 is removed by the RIE while the mask nitride film 627 serves as a mask. As a result, the cylindrical mask nitride film 627 and a cylindrical mask sacrificial film 628 are formed.

Them, as shown in FIG. 6I, polysilicon for forming first and second storage nodes 615 and 616 of capacitors later is deposited on the entire surface in the thickness of 1000~5000 Å by a CVD method. Impurities such as phosphorus or the like are introduced into polysilicon to enhance the conductivity of polysilicon. Thereafter, etching is performed to render the polysilicon in which the impurities such as phosphorus or the like are introduced to remain only on the inner and outer side walls of the mask nitride film 627 and the mask sacrificial film 628.

Thereafter, the mask nitride film 627 and the mask sacrificial film 628 are removed by a normal etching technique, thereby forming the first cylindrical and second storage nodes 615 and 616 as shown in FIG. 6J. That is, the polysilicon rendered to remain on the outer side walls of the mask nitride film 627 and the mask sacrificial film 628 becomes the first storage node 615 and the polysilicon rendered to remain on the inner side walls of the mask nitride film 627 and the mask sacrificial film 628 becomes the second storage node 616.

Thereafter, a capacitor nitride film, not shown, is formed on the stopper nitride film 610 to cover the first and second storage nodes 615 and 616. Polysilicon forming a self-plate is deposited on the capacitor nitride film, thereby forming capacitors of a memory cell.

In the method of fabricating a semiconductor device according to the sixth embodiment, the polysilicon film is formed on the inner and outer side walls of the cylindrical mask nitride film and the cylindrical sacrificial film so that the storage nodes of two capacitors are formed to extend to the areas where respective memory cells are formed. That is, two capacitors are formed on self alignment. Accordingly, it is possible to form capacitors which securing the charge storage capacity necessary for tolerance to a soft error while the increase in the number of photolithographic and etching processes is restricted compared with a case where two storage nodes are individually formed.

FIGS. 7A to 7J respectively show a method of fabricating a semiconductor device according to a seventh embodiment of the invention. The seventh embodiment relates to a method of fabricating the semiconductor device as explained in the fourth embodiment.

Figure 7:
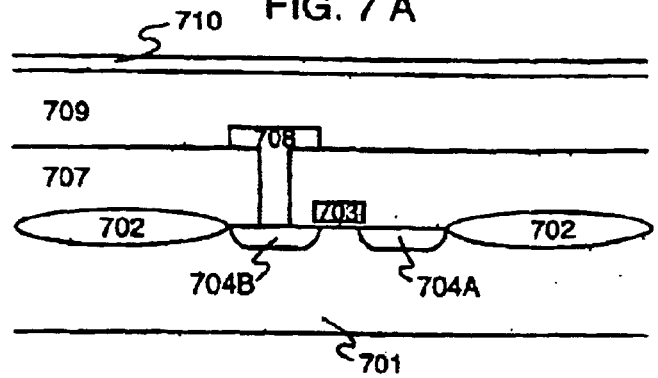
FIGS. 7A to 7J are respectively sectional views and plan views showing a method of fabricating a semiconductor device according to a seventh embodiment of the invention.
Figure 7:
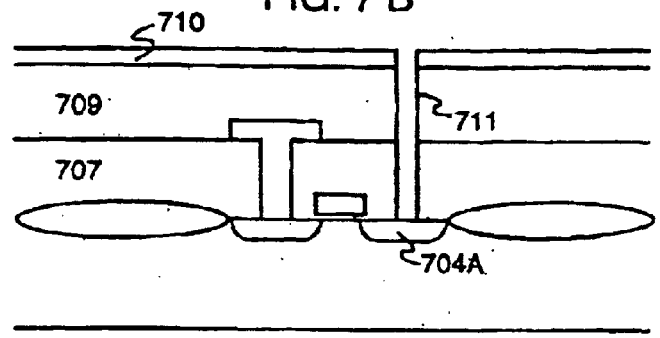
Figure 7:
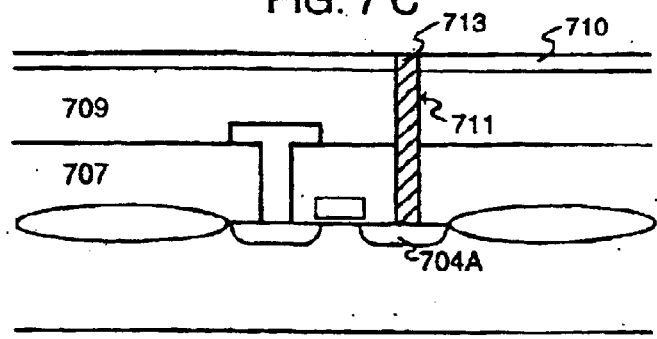
Figure 7:
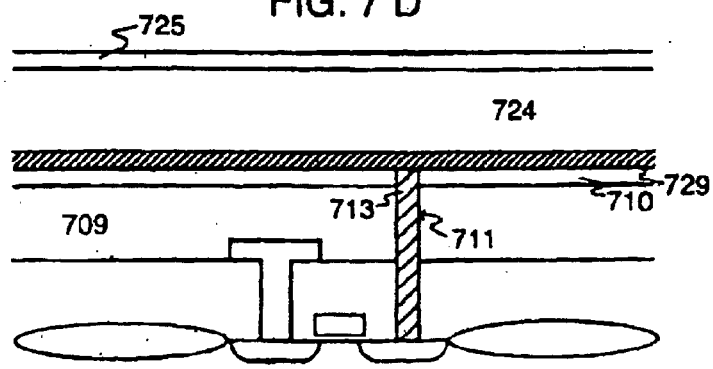

As shown in FIG. 7A, field oxide films 702 for partitioning activation areas are formed on a semiconductor substrate 701 in the thickness of 2000~5000 Å by a LOCOS (Local Oxidation of Silicon) method. Formed on the activation areas are a gate electrode 703 and impurity diffusion layers 704A and 704B. Thereafter, an oxide film or a BPSG film are deposited on the entire surface in the thickness of 1000~5000 Å by a CVD method, thereby forming a first interlevel insulating film 707. A contact hole is defined in the first interlevel insulating film 707 to expose the impurity diffusion layer 704B, and a bit line 708 is formed to be embedded in the contact hole. Thereafter, a second interlevel insulating film 709 is formed on the entire surface by depositing the oxide film or the BPSG film in the thickness of 1000~5000 Å by a CVD method A stopper nitride film 710 is formed by depositing a nitride film on the second interlevel insulating film 709 in the thickness of 200~1000 Å to protect the second interlevel insulating film 709 against an etching process.

Next, as shown in FIG. 7B, a first contact hole 711 is defined in the first interlevel insulating film 707, the second interlevel insulating film 709 and the stopper nitride film 710 to expose the impurity diffusion layer 704A by normal photolithographic and etching techniques.

Then, as shown in FIG. 7C, polysilicon is deposited on the entire surface to be embedded in the first contact hole 711 by a CVD method Impurities such as phosphorus or the like are introduced into polysilicon to enhance the conductivity of polysilicon. Thereafter, polysilicon other than polysilicon embedded in the first contact hole 711 is removed by etching. As a result, a first polysilicon plug 713 is formed in the first contact hole 711. At this time, since the stopper nitride film 710 serves as a film to stop the etching, the second interlevel insulating film 709 is prevented from being etched.

Then, as shown in FIG. 7D, a polysilicon film 729 is deposited on the entire surface of the stopper nitride film 710 in the thickness of 1000~2000 Å by a CVD method. Impurities such as phosphorus or the like are introduced into the polysilicon film 729 to enhance the conductivity of the polysilicon film 729. Thereafter, the oxide film or a BPSG film is deposited on the polysilicon film 729 in the thickness of 2000~8000 Å by a CVD method. The oxide film or the BPSG film becomes a sacrificial film 724 for forming a cylindrical storage node later. Further, a polysilicon film 725 is deposited on the sacrificial film 724 in the thickness of 1000~3000 Å.

Figure 7E:
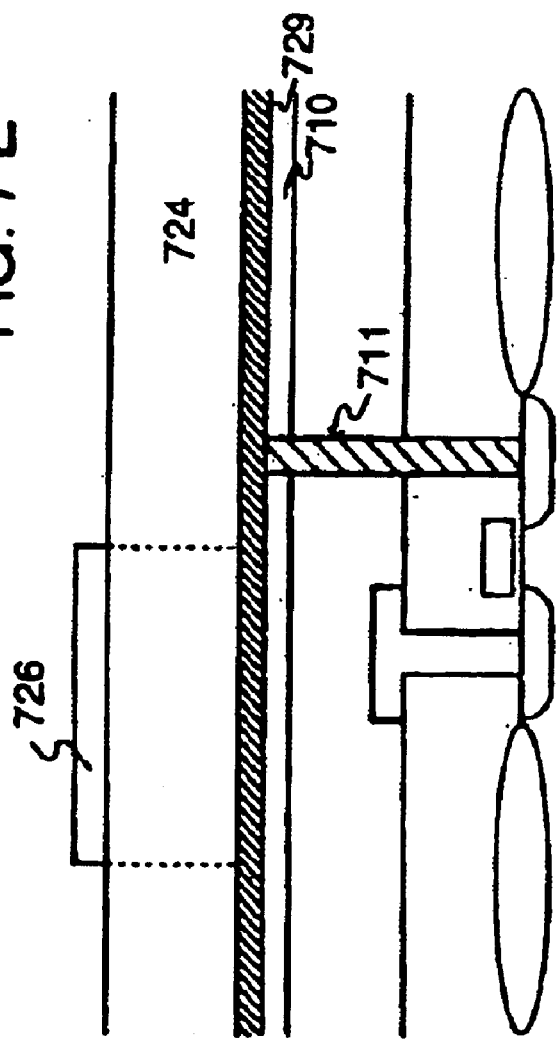

Then, as shown in a sectional view of FIG. 7E, a mask polysilicon 726 is formed by subjecting the polysilicon film 725 to patterning by normal photolithographic and etching techniques. At this time, as shown in a plan view of FIG. 7E, the patterning of the polysilicon film 725 is performed so as not to cover the first contact hole 711.

Next, as shown in a sectional view of FIG. 7F, a nitride film is deposited on the sacrificial film 724 and the mask polysilicon 726 in the thickness of 1000~2000 Å by a CVD method, then a mask nitride film 727 is formed by rendering the nitride film to remain only on the side walls of the mask polysilicon 726 alone by a reactive ion etching (RIE). At this time, as shown in the plan view of FIG. 7F, the mask nitride film 727 is formed not to cover the first contact hole 711.

Then, as shown in FIG. 7G, the mask polysilicon 726 is removed by a normal etching technique.

Then, as shown in FIG. 7H, the sacrificial film 724 and the polysilicon film 729 are removed by a RIE while the mask nitride film 727 serves as a mask. As a result, the mask nitride film 727, a mask sacrificial film 728 and a third storage node 723 which are respectively cylindrical are formed.

Then, as shown in FIG. 7I, polysilicon for forming first and second storage nodes 715 and 716 of capacitors later is deposited on the entire surface of the stopper nitride film 710 in the thickness of 1000~5000 Å by a CVD method Impurities such as phosphorus or the like are introduced into polysilicon to enhance the conductivity of polysilicon. Thereafter, etching is performed to render the polysilicon in which the impurities such as phosphorus or the like are introduced to remain only on the inner and outer side walls of the mask nitride film 727, the mask sacrificial film 728 and the third storage node 723.

Thereafter, the mask nitride film 727 and the mask sacrificial film 728 are removed by a normal etching technique, thereby forming the first and second cylindrical storage nodes 715 and 716 as shown in FIG. 7J. At this time, the third storage node 723 remains without being etched. That is, the polysilicon rendered to remain on the outer side walls of the mask nitride film 727, the mask sacrificial film 728 and the third storage node 723 becomes the first storage node 715 and the polysilicon rendered to remain on the inner side walls thereof becomes the second storage node 716. The first and second storage nodes 715 and 716 are connected to each other by way of the third storage node 723, thereby forming cylindrical storage nodes of capacitors of one memory cell by the first, second and third storage nodes 715, 716 and 723 and the first polysilicon plug 713. Thereafter, formed on the stopper nitride film 710 is a capacitor nitride film, not shown, so as to cover the first, second and third storage nodes 715, 716 and 723. Polysilicon forming a self-plate is deposited on the capacitor nitride film, thereby forming completing capacitors of a memory cell.

As mentioned above, in the method of fabricating the semiconductor device according to the seventh embodiment, the first and second storage nodes constituting the side wall of the cylindrical storage nodes are formed at the same time by forming polysilicon on the inner and outer side walls of the cylindrical mask nitride film and the cylindrical sacrificial film. That is, capacitors each provided with a storage node having a double structured side wall are formed with self-alignment. Accordingly, the capacitors capable of securing a charge capacity necessary for tolerance to a soft error are formed while the increase in the number of photolithographic and etching processes is restricted.

FIGS. 8A to 8J respectively show a method of fabricating a semiconductor device according to an eighth embodiment of the invention. The eighth embodiment relates to a method of fabricating the semiconductor device as explained in the fifth embodiment.

Figure 8:
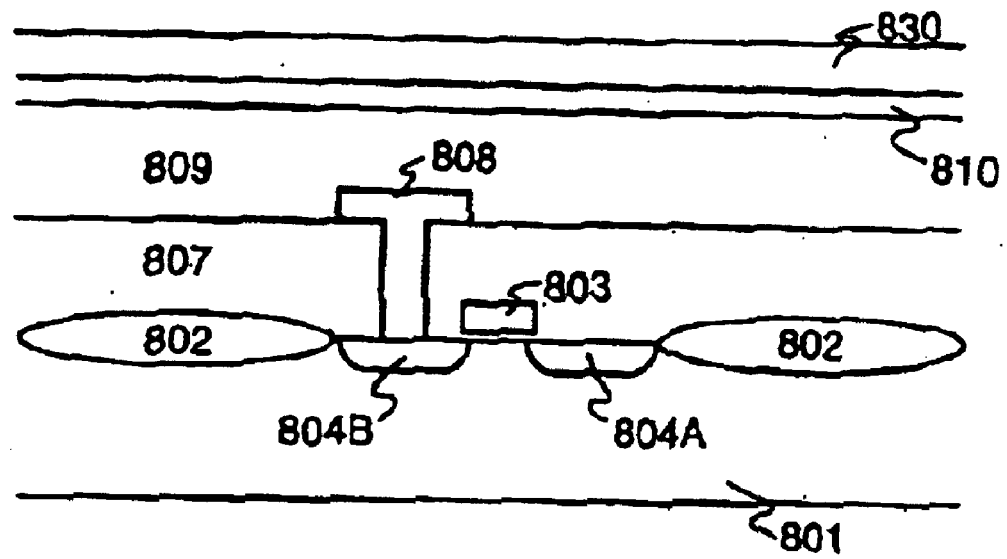
FIGS. 8A to 8J are respectively sectional views and plan views showing a method of fabricating a semiconductor device according to an eighth embodiment of the invention.
Figure 8:
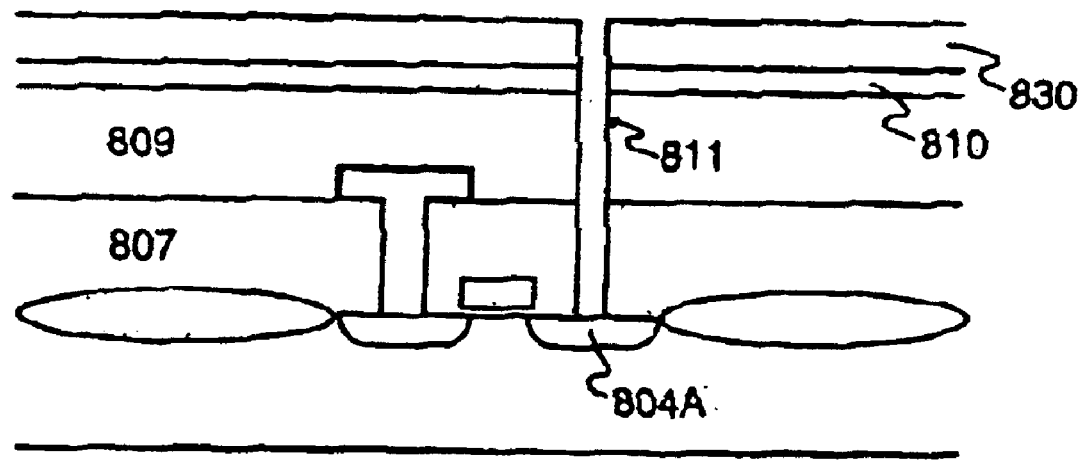
Figure 8:
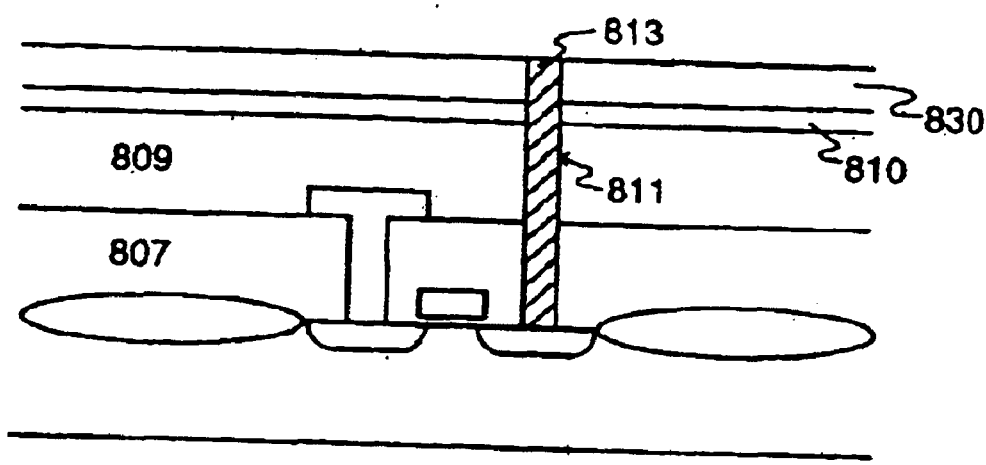
Figure 8:
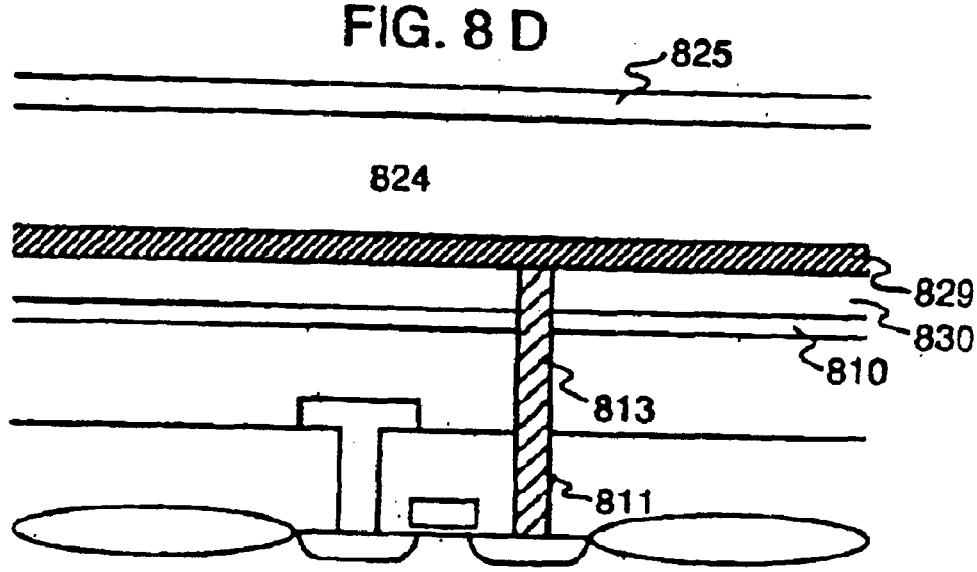

As shown in FIG. 8A, field oxide films 802 for partitioning activation areas are formed on a semiconductor substrate 801 in the thickness of 2000~5000 Å by a LOCOS (Local Oxidation of Silicon) method. Formed on the activation areas are a gate electrode 803 and impurity diffusion layers 804A and 804B. Thereafter, an oxide film or a BPSG film are deposited on the entire surface in the thickness of 1000~5000 Å by a CVD method, thereby forming a first interlevel insulating film 807. A contact hole is formed in the first interlevel insulating film 807 to expose the impurity diffusion layer 804B, and a bit line 808 is formed to be embedded in the contact hole. Thereafter, a second interlevel insulating film 809 is formed on the entire surface of the first interlevel insulating film 807 by depositing the oxide film or the BPSG film in the thickness of 1000~5000 Å by a CVD method. A stopper nitride film 810 is formed by depositing a nitride film on the second interlevel insulating film 809 in the thickness of 200~1000 Å to protect the second interlevel insulating film 809 against an etching process. A first sacrificial film 830 is formed by depositing an oxide film or a BPSG film on the stopper nitride film 810 in the thickness of 1000~2000 Å by a CVD method.

Next, as shown in FIG. 8B, a first contact hole 811 is defined in the first interlevel insulating film, 807, the second interlevel insulating film 809, the stopper nitride film 810 and the first sacrificial film 830 to expose the impurity diffusion layer 804A by normal photolithographic and etching techniques.

Then, as shown in FIG. 8C, polysilicon is deposited on the entire surface to be embedded in the first contact hole 811 by a CVD method. Impurities such as phosphorus or the like are introduced into polysilicon to enhance the conductivity of polysilicon. Thereafter, polysilicon other than polysilicon embedded in the first contact hole 811 is removed by etching. As a result, a first polysilicon plug 813 is formed in the first contact hole 811.

Then, as shown in FIG. 8D, a polysilicon film 829 is formed on the entire surface in the thickness of 1000~2000 Å by a CVD method. Impurities such as phosphorus or the like are introduced into the polysilicon film 829 to enhance the conductivity of the polysilicon film 829. Thereafter, an oxide film or a BPSG film is deposited on the polysilicon film 829 in the thickness of. 2000~8000 Å by a CVD method, thereby forming a second sacrificial film 824. Still thereafter, a polysilicon film 825 is deposited on the second sacrificial film 824 in the thickness of 1000~3000 Å by a CVD method.

Then, as shown in a sectional view of FIG. 8E, a mask polysilicon 826 is formed by subjecting the polysilicon film 825 to patterning by normal photolithographic and etching techniques. At this time, as shown in a plan view of FIG. 8E, the patterning of the polysilicon film 825 is performed so as not to cover the first contact hole 811. Next, as shown in a sectional view of FIG. 8F, a nitride film is deposited on the second sacrificial film 824 and the mask polysilicon 826 in the thickness of 1000~2000 Å by a CVD method, then a mask nitride film 827 is formed by rendering the nitride film to remain only on the side wall of the mask polysilicon 826 by a reactive ion etching (RIE). At this time, as shown in the plan view of FIG. 7F, the mask nitride film 827 is formed not to cover the first contact hole 811.

Then, as shown in FIG. 8G, the mask polysilicon 826 is removed by a normal etching technique.

Then, as shown in FIG. 8H, the second sacrificial film 824 and the polysilicon film 829 are removed by the RIE while the mask nitride film 827 serves as a mask. As a result, the mask nitride film 827 and a mask sacrificial film 828 and a third storage node 823 which are respectively cylindrical are formed.

Then, as shown in FIG. 8I, polysilicon for forming first and second storage nodes 815 and 816 of capacitors later is deposited on the entire surface in the thickness of 1000~5000 Å by a CVD method. After impurities such as phosphorus or the like are introduced into polysilicon to enhance the conductivity of polysilicon, etching is performed to render the polysilicon in which the impurities such as phosphorus or the like are introduced to remain only on the inner and outer side walls of the mask nitride film 827, the mask sacrificial film 828 and the third storage node 823.

Thereafter, the mask nitride film 827 and the mask sacrificial film 828 are removed by a normal etching technique, and the first sacrificial film 830 is removed by a wet etching technique utilizing hydrofluoric acid, or the like, or an isotropic etching technique. As a result, as shown in FIG. 8J, the first cylindrical and second storage nodes 815 and 816 are formed. At this time, the third storage node 823 remains without being etched. That is, the polysilicon rendered to remain on the outer side walls of the mask nitride film 827, the mask sacrificial film 828 and the third storage node 823 becomes the first storage node 815 and the polysilicon rendered to remain on the inner side walls of the mask nitride film 827, the mask sacrificial film 828 and the third storage node 823 becomes the second storage node 816. The first and second storage nodes 815 and 816 are connected to each other by way of the third storage node 823, whereby cylindrical storage nodes of capacitors of one memory cell are constituted by the first and second storage nodes 815 and 816 and the first polysilicon plug 813.

Thereafter, a capacitor nitride film, not shown, is formed on the stopper nitride film 810 so as to cover the first, second and third storage nodes 815, 816 and 823 and the polysilicon plug 813. Polysilicon forming self-plate is deposited on the capacitor nitride film.

As mentioned above, in the method of fabricating the semiconductor device according to the eighth embodiment of the invention, the first and second storage nodes constituting the wall portions of the cylindrical storage nodes are formed at the same time by forming polysilicon on the inner and outer side walls of the cylindrical mask nitride film and the cylindrical sacrificial film. That is, the capacitors provided with the cylindrical storage nodes having a double structured wall portion are formed with self-alignment. Accordingly, capacitors capable of securing charge storage capacity necessary for tolerance to a soft error while the increase in the number of photolithographic and etching processes is restricted.

What is claimed is:

1. A method of fabricating a semiconductor device, comprising:

preparing a semiconductor substrate having a principal surface;

forming first and second transistors on the principal surface of the semiconductor substrate;

forming an insulating film on the principal surface of the semiconductor substrate so as to cover the first and second transistors;

defining a first opening in the insulating film which exposes a source or a drain of the first transistor;

defining a second opening in the insulating film which exposes a source or a drain of the second transistor;

embedding a first conductive material in the first opening and a second conductive material in the second opening;

forming a mask pattern on the insulating film which surrounds the second opening and which does not surround the first opening, wherein the mask pattern has an inner side wall which faces towards the second opening, and an outer side wall which faces towards the first opening;

forming a first storage node on the outer side wall of the mask pattern so that the first storage node is connected to the first conductive material in the first opening, and forming a second storage node on the inner side wall of the mask pattern so that the second storage node is connected to the second conductive material in the second opening, wherein the second storage node is surrounded by the first storage node and wherein a thickness of the second storage node in a direction parallel to the principal surface of the semiconductor substrate is greater than a thickness of the first storage node in the direction parallel to the principal surface of the semiconductor substrate;

removing the mask pattern between the first storage node and the second storage node;

forming a capacitor insulating film on the insulating film so as to cover the first and second storage nodes; and forming a self-plate on the capacitor insulating film.

2. The method according to claim 1, wherein the mask pattern, the first storage node and the second storage node have rectangular enclosed cross-sections in a plane parallel to the principal surface of the substrate.

3. The method according to claim 1, wherein the first storage node is formed on the first conductive material in the first opening, and the second storage node is formed on the second conductive material in the second opening.

4. The method according to claim 2, wherein the first storage node is formed on the first conductive material in the first opening, and the second storage node is formed on the second conductive material in the second opening.

5. The method according to claim 1, wherein a charge storage surface area of the first storage node is the same as a charge storage surface area of the second storage node.

6. The method according to claim 2, wherein a charge storage surface area of the first storage node is the same as a charge storage surface area of the second storage node.

7. The method according to claim 3, wherein a charge storage surface area of the first storage node is the same as a charge storage surface area of the second storage node.

8. The method according to claim 4, wherein a charge storage surface area of the first storage node is the same as a charge storage surface area of the second storage node.

* * * * *